(12) United States Patent
Iyer et al.

(10) Patent No.: US 10,749,714 B2
(45) Date of Patent: Aug. 18, 2020

(54) HIGH SPEED RECEIVER

(71) Applicant: Avago Technologies International Sales Pte. Limited, Singapore (SG)

(72) Inventors: Arvindh Iyer, Irvine, CA (US); Kumar Thasari, Irvine, CA (US); Bo Zhang, Irvine, CA (US); Heng Zhang, Irvine, CA (US); Jaehun Jeong, Irvine, CA (US); Ullas Singh, Irvine, CA (US); Namik Kocaman, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/236,145

(22) Filed: Dec. 28, 2018

(65) Prior Publication Data
US 2020/0213165 A1 Jul. 2, 2020

(51) Int. Cl.
*H04L 25/03* (2006.01)
*H04L 25/49* (2006.01)
*H03K 3/037* (2006.01)
*H03K 5/24* (2006.01)

(52) U.S. Cl.
CPC .... *H04L 25/03006* (2013.01); *H04L 25/4917* (2013.01); *H03K 3/037* (2013.01); *H03K 5/249* (2013.01)

(58) Field of Classification Search
CPC ......... H04L 25/03019; H04L 25/03006; H04L 25/4917; H03K 3/037; H03K 5/249
See application file for complete search history.

(56) References Cited

U.S. PATENT DOCUMENTS

| 2014/0266450 A1 | 9/2014 | Talegaonkar et al. |
| 2016/0191276 A1* | 6/2016 | Sakai ..................... H04L 27/02 375/233 |
| 2016/0261435 A1* | 9/2016 | Musah .............. H04L 25/03019 |
| 2016/0349380 A1* | 12/2016 | Shirahama ................ G01T 1/17 |

* cited by examiner

*Primary Examiner* — Janice N Tieu
(74) *Attorney, Agent, or Firm* — Foley & Lardner LLP

(57) ABSTRACT

Disclosed herein are related to a system and a method for high speed communication. In one aspect, the system includes a set of slicers configured to generate a slicer output signal digitally indicating a level of an input signal received by the set of slicers. The system includes a speculative tap coupled to the set of slicers, where the speculative tap is configured to select bits of the slicer output signal based on selected bits of a prior slicer output signal. The system includes a decoder coupled to the speculative tap, where the decoder is configured to decode the selected bits of the slicer output signal in a first digital representation into a second digital representation. The system includes a feedback generator coupled to the decoder, where the feedback generator is configured to generate a feedback signal according to the decoded bits of the slicer output signal.

20 Claims, 21 Drawing Sheets

HIGH SPEED RECEIVER

FIELD OF THE DISCLOSURE

This disclosure generally relates to systems and methods for communication. In particular, this disclosure relates to systems and methods for improving a communication speed of a receiver based on a pulse amplitude modulated signal.

BACKGROUND OF THE DISCLOSURE

Proliferation of communication technology enables multiple devices to communicate with each other. For example, two computing devices exchange content data (e.g., text, image, video, etc.). In one approach, content data is exchanged in an encoded format to improve bandwidth. For example, a transmitter encodes content data according to a pulse amplitude modulation (PAM) protocol and transmits the encoded data. A PAM protocol represents a value of data according to amplitude of a pulse. For example, amplitude of 100 mV of a pulse indicates a logic value '0', amplitude of 200 mV of a pulse indicates a logic value '1', amplitude of 300 mV of a pulse indicates a logic value '2', and amplitude of 400 mV of a pulse indicates a logic value '3'. Accordingly, a single pulse can convey multiple bits of information, thereby improving a communication bandwidth.

Communication through a PAM protocol presents difficulties to a receiver design. For example, a receiver detects amplitude of a pulse from data received, and decodes the received data to obtain content data. Sensing amplitude of high speed data (e.g., over 50 Gbps) and decoding data according to the sensed amplitude involve a complex and challenging process. For example, a signal received by the receiver is subject to a distortion because of inter symbol interference (ISI). Specifically, energy in a symbol of a signal is spread over to the adjacent symbol. In some implementation, the receiver includes circuitries to compensate for such distortion. However, the circuitries to compensate for the distortion due to ISI degrade the receiver performance (e.g., speed) and consume additional hardware resources.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
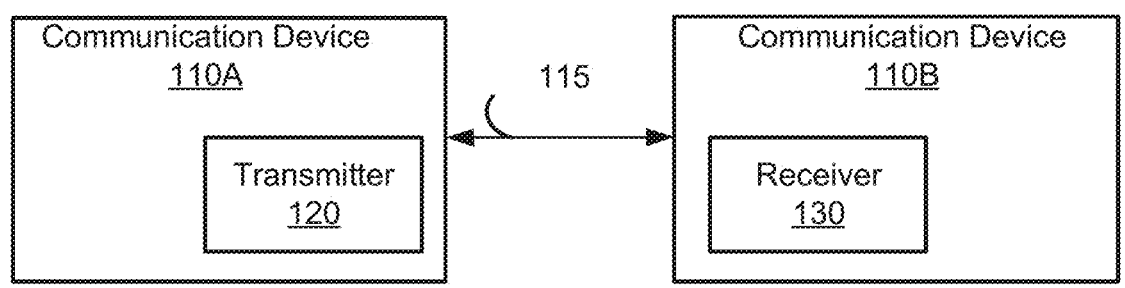
FIG. 1 is a diagram depicting an example communication environment.

The details of various embodiments of the methods and systems are set forth in the accompanying drawings and the description below.

DETAILED DESCRIPTION

For purposes of reading the description of the various embodiments below, the following descriptions of the sections of the specification and their respective contents may be helpful:

Section A describes embodiments of a high speed receiver; and

Section B describes a network environment and computing environment which may be useful for practicing embodiments described herein.

A. High Speed Receiver

Disclosed herein are related to various aspects of systems (or apparatuses), methods, and non-transitory computer readable medium for high speed communication.

In one aspect, a system includes a set of slicers configured to generate a slicer output signal digitally indicating a level of an input signal received by the set of slicers. In some embodiments, the system includes a speculative tap coupled to the set of slicers, where the speculative tap is configured to select bits of the slicer output signal based on selected bits of a prior slicer output signal. In some embodiments, the system includes a decoder coupled to the speculative tap, where the decoder is configured to decode the selected bits of the slicer output signal in a first digital representation into a second digital representation. In some embodiments, the system includes a feedback generator coupled to the decoder, where the feedback generator is configured to generate a feedback signal according to the decoded bits of the slicer output signal. In one aspect, the feedback signal modifies a subsequent symbol of the input signal to reduce distortion due to ISI.

Advantageously, an operating speed of the system is improved by selecting bits of the slicer output signal based on selected bits of a prior slicer output signal, in some embodiments. In one aspect, a prior slicer output signal of a slicer output signal precedes the slicer output signal by one or more symbols. In some embodiments, the selected bits of the prior slicer output signal are received from the speculative tap coupled to the set of slicers or from another speculative tap coupled to another set of slicers. In some embodiments, the set of slicers operates according to a clock signal, where the another set of slicers operates according to a 90 degrees phase shifted clock signal or a 180 degrees phase shifted clock signal. By selecting bits of the slicer output signal based on a prior slicer output signal rather than a decoded output of the set of slicers, a critical path delay of the set of slicers is reduced in some embodiments, thus operating speed of the system is improved.

In one aspect, the speculative tap exploits redundancy of bits of a control signal (or the prior slicer output signal) to reduce a critical path delay. In some embodiments, the speculative tap includes a multiplexer that selects from a number of bits of the slicer output signal less than a total number of different values representable by the control signal (or the prior slicer output signal). For example, the speculative tap includes a 4-1 multiplexer operating according to a 3 bit control signal that has eight different representable values. Although a 2 bit control signal is sufficient to control a 4-1 multiplexer, by exploiting the redundancy of the control signal, the speculative tap operates without a decoder between the speculative tap and a component (e.g. the speculative tap or another speculative tap) generating the control signal to reduce the critical path delay, in some embodiments.

In one aspect, the speculative tap is controlled and outputs data in a differential representation to improve operating speed. In some embodiments, the speculative tap selects bits of the slicer output signal based on selected bits of a prior slicer output signal in differential representation. Accordingly, any delay associated with generating an inverted signal of the slicer output signal is obviated, hence a critical path delay of the set of slicers is reduced.

In one aspect, each slicer includes an improved comparator with a clock kickback compensation. In some embodiments, a comparator compares an input signal at an input port and a reference signal at a reference port according to a pulse of a clock signal, and generates an output signal indicating a level of the input signal according to the comparison. In some embodiments, the comparator includes or is coupled to a kickback cancellation circuit that injects a delayed clock signal to the input port. In one aspect, the delayed clock signal is delayed from the clock signal. Without a kickback cancellation circuit, a pulse of a clock signal degrades the input signal, output signal, or a combination of the input signal and the output signal of the comparator, for example, through a parasitic coupling in some embodiments. By employing the kickback cancellation circuit that injects the delayed clock signal to the input port, degradation due to the parasitic coupling of the pulse of the clock signal is mitigated. Accordingly, sensitivity of the comparator is improved, in some embodiments. In one aspect, sensitivity of a comparator is the smallest input amplitude that renders reliable operation of a slicer.

In one aspect, each slicer includes an improved SR latch coupled to the comparator. In some embodiments, the SR latch includes a sensing circuit and a regeneration circuit. In some embodiments, the sensing circuit senses the output signal of the comparator according to the pulse of the clock signal, and the regeneration circuit amplifies the sensed signal from the sensing circuit. In one aspect, the SR latch is implemented as complementary metal oxide semiconductor (CMOS) circuitries that perform faster sensing and amplification than conventional circuitries (e.g., CMOS NOR circuitries) with reduced hardware resources (e.g., chip area).

Although various embodiments disclosed herein are described with respect to PAM4 protocol, general principles disclosed herein are applicable to any communication protocol.

Referring to FIG. 1, illustrated is a diagram depicting an example communication environment 100. In FIG. 1, the communication environment 100 includes a communication device 110A and a communication device 110B that are communicatively coupled to each other through a network 115. In some embodiments, the network 115 is a wired network, wireless network, or a combination of the wired network and the wireless network. In some embodiments, these components communicate with each other through the network 115 to exchange content data (e.g., text, image, video, etc.). In some embodiments, the communication environment 100 includes any number of communication devices 110.

In some embodiments, the communication device 110A includes a transmitter 120 (also referred to as "a transmitter circuit 120" herein) and the communication device 110B includes a receiver 130 (also referred to as "a receiver circuit 130" herein). In some embodiments, the transmitter 120 encodes content data according to a PAM protocol, and transmits the content data through the network 115. In some embodiments, the receiver 130 receives the encoded data from the transmitter 120 of another communication device 110, and decodes the received data to obtain the content data.

Figure 2:
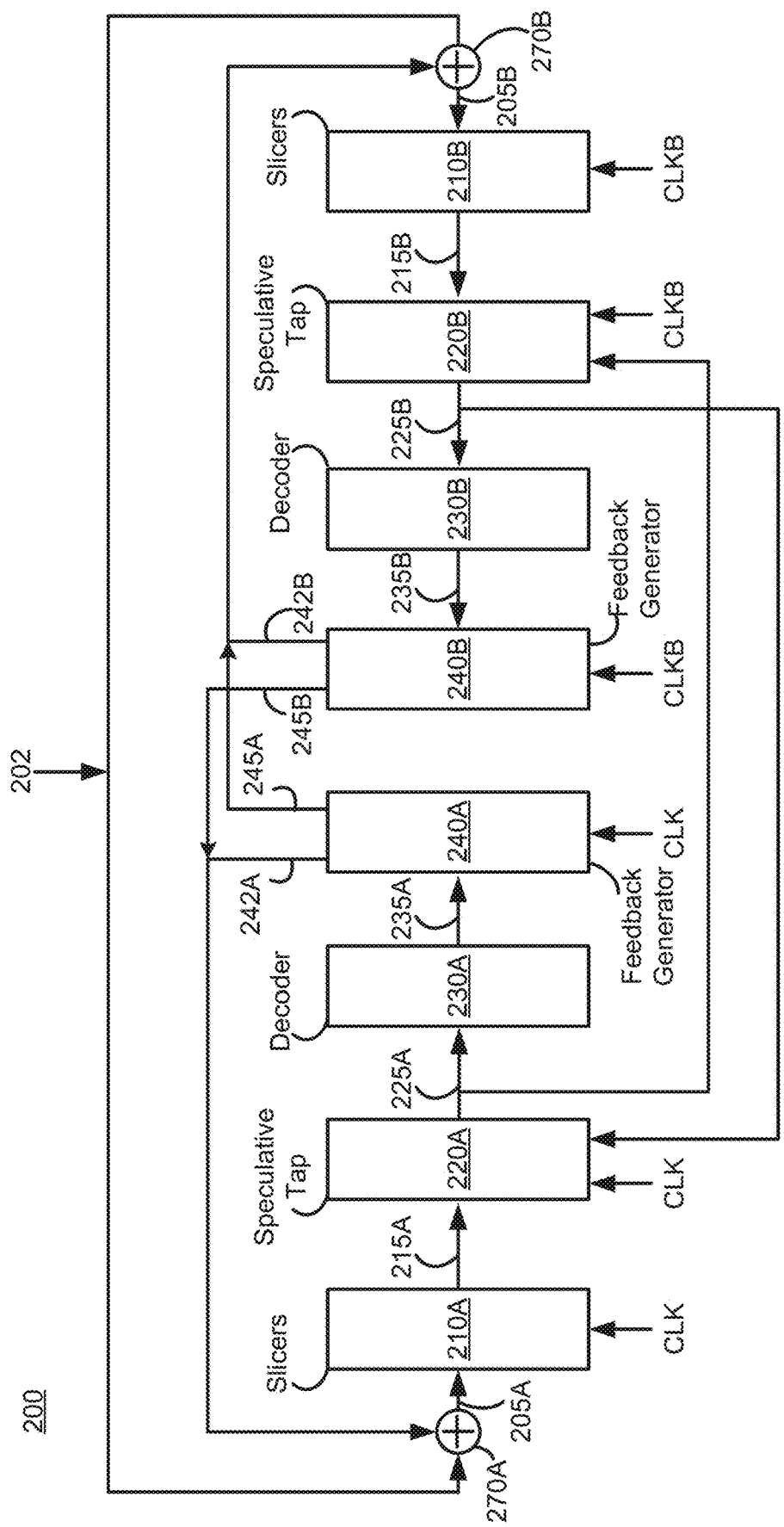
FIG. 2 is a diagram depicting an example receiver device.

Referring to FIG. 2, illustrated is a schematic diagram depicting an example receiver apparatus 200. In some embodiments, the receiver apparatus 200 is implemented as the receiver 130 of FIG. 1. In some embodiments, the receiver apparatus 200 includes slicers 210A, 210B (also referred to as "slicer circuits 210" herein), speculative taps 220A, 220B (also referred to as "speculative tap circuits 220" herein), decoders 230A, 230B (also referred to as "decoder circuits 230" herein), feedback generators 240A, 240B (also referred to as "feedback generator circuits 240" herein), and adders 270A, 270B. These components operate together to receive an input signal 202, and generate decoded signals 235A, 235B according to the input signal 202. In some embodiments, the input signal 202 is a PAM4 signal from another device (e.g., communication device 110). In some embodiments, the receiver apparatus 200 includes more, fewer, or different components than shown in FIG. 2.

In some embodiments, the receiver apparatus 200 performs decision feedback equalization. In one approach, the input signal 202 is modified by feedback signals 242A, 245A, 242B, 245B from the feedback generators 240A, 240B. In some embodiments, the adder 270A receives the input signal 202 and the feedback signals 242A, 245B, and adds the feedback signals 242A, 245B to the input signal 202 to obtain a modified input signal 205A. In some embodiments, the adder 270B receives the input signal 202 and the feedback signals 242B, 245A, and adds the feedback signals 242B, 245A to the input signal 202 to obtain a modified input signal 205B. Without the feedback signals 242A, 245A, 242B, 245B, the input signal 202 received by the receiver apparatus 200 is subject to a distortion because of an inter symbol interference (ISI). For example, energy in a previous symbol of the input signal 202 spreads over to a subsequent symbol. In some embodiments, distortions due to a prior symbol of the input signal are predicted and compensation is applied to a subsequent symbol of the input signal 202 according to the predicted distortions to obtain modified input signals 205A, 205B with reduced distortions.

A set of slicers 210A is a circuit that receives the modified input signal 205A and generates a slicer output signal 215A indicating a level of the modified input signal 205A. In one configuration, the set of slicers 210A includes input ports, a clock port, and output ports. In this configuration, the set of slicers 210A receives the modified input signal 205A at the input ports, and receives a clock signal CLK at the clock port. In some embodiments, the set of slicers 210A generates the slicer output signal 215A according to a pulse of the clock signal CLK, and outputs the slicer output signal 215A at the output ports. In one example, the set of slicers 210A samples the modified input signal 205A, in response to a rising edge, a falling edge, a high state (or logic '1') or a low state (or logic '0') of the clock signal CLK, and generates the slicer output signal 215A indicating a voltage level of the sampled signal in a thermometer code. For example, the slicer output signal 215A indicates the voltage level of the sampled signal in 12 bits, because with one tap ISI, a PAM4 signal can have one of twelve levels, for example, as described below with respect to FIG. 3. The set of slicers 210A provides the slicer output signal 215A to the speculative tap 220A. Detailed implementations and operations of the slicers 210 are provided below with respect to FIGS. 2 through 10.

A speculative tap 220A is a circuit that receives the slicer output signal 215A, and selects bits of the slicer output signal 215A. In one configuration, the speculative tap 220A includes i) input ports coupled to output ports of the set of slicers 210A, ii) control ports coupled to output ports of the speculative tap 220B, iii) a clock port, and iv) output ports. In this configuration, the speculative tap 220A receives the slicer output signal 215A at the input ports, receives outputs of the speculative tap 220B at the control ports, and receives the clock signal CLK at the clock port. In some embodiments, the speculative tap 220A selects outputs of a subset of the set of slicers 210A or selects bits of the slicer output signal 215A according to a speculative tap output signal 225B from the speculative tap 220B at the control ports, and outputs the selected outputs as a speculative tap output signal 225A at the output ports. In one example, the slicer output signal has twelve bits, and the speculative tap output signal 225A has three bits. In some embodiments, the speculative tap 220A stores the selected bits of the slicer output signal 215A in response to a pulse of the clock signal CLK, and provides the stored bits to the decoder 230A and the speculative tap 220B. In some embodiments, outputs of the speculative tap 220B correspond to selected outputs of a subset of the set of slicers 210B. In some embodiments, the set of slicers 210A operates according to the clock signal CLK, and the set of slicers 210B operates according to an inverted clock signal CLKB, such that the modified input signal 205A includes odd symbols and the modified input signal 205B includes an even symbol. Hence, in one aspect, the outputs of the speculative tap 220B correspond to one symbol prior to the outputs of the speculative tap 220A. In one aspect, the speculative tap 220A forms a feedback loop with the speculative tap 220B without any decoder in the feedback loop. Detailed implementations and operations of the speculative tap 220 are provided below with respect to FIGS. 11 through 14.

A decoder 230A is a circuit that decodes the speculative tap output signal 225A, and generates a decoded signal 235A. In one configuration, the decoder 230A includes i) input ports coupled to output ports of the speculative tap 220A, and ii) output ports. In this configuration, the decoder 230A receives the selected outputs of the subset of the set of slicers 210A as the speculative tap output signal 225A at the input ports. In some embodiments, the decoder 230A decodes the speculative tap output signal 225A to obtain a decoded signal 235A, and outputs the decoded signal 235A at the output ports. In one aspect, the decoder 230A decodes the speculative tap output signal 225A in a thermometer code into a binary code to obtain the decoded signal 235A. For example, the decoder 230A decodes three thermometer bits of the speculative tap output signal 225A into two binary bits of the decoded signal 235A.

A feedback generator 240A is a circuit that receives the decoded signal 235A and generates feedback signals 242A, 245A. In one configuration, the feedback generator 240A includes i) input ports coupled to the output ports of the decoder 230A, ii) a clock port, and iii) output ports coupled to the input ports of the slicers 210A, 210B. In this configuration, the feedback generator 240A receives the decoded signal 235A at the input ports, and receives the clock signal CLK at the clock port. In some embodiments, the feedback generator 240A generates the feedback signals 242A, 245A according to the decoded signal 235A and the clock signal CLK, and outputs the feedback signals 242A, 245A at the output ports. In one implementation, the feedback signal 242A modifies the input signal 202 to obtain the modified input signal 205A, and the feedback signal 245A modifies the input signal 202 to obtain the modified input signal 205B. In one aspect, modifying the input signal 202 based on the feedback signals 242A, 245A allows for mitigation of distortion due to ISI. In some embodiments, the feedback generator 240A includes one or more taps including a latch, a single ended to differential converter, and an amplifier. Detailed implementations and operations of the feedback generator 240A are provided below with respect to FIGS. 15 through 19.

In some embodiments, the adder 270B, the set of slicers 210B, the speculative tap 220B, the decoder 230B, and the feedback generator 240B are configured and operate together according to input signal 202, modified input signal 205B, slicer output signal 215B, speculative tap output signal 225B, inverted clock signal CLKB, decoded signal 235B, and feedback signals 242B, 245B, in a similar manner with respect to the adder 270A, the set of slicers 210A, the speculative tap 220A, the decoder 230A, and the feedback generator 240A according to the input signal 202, the modified input signal 205A, the slicer output signal 215A, the speculative tap output signal 225A, the clock signal CLK, the decoded signal 235A, and the feedback signals 242A, 245A. Thus, the duplicative description thereof is omitted herein for the sake of brevity.

Although the apparatus 200 shown in FIG. 2 employs a half-clock rate architecture, where the adder 270A, the set of slicers 210A, the speculative tap 220A, the decoder 230A, and the feedback generator 240A operate according to a clock signal CLK, and the adder 270B, the set of slicers 210B, the speculative tap 220B, the decoder 230B, and the feedback generator 240B operate according to the inverted clock signal CLKB, in other embodiments the apparatus 200 employs a different architecture. For example, the apparatus 200 employs a full-clock rate architecture, where the adder 270B, the set of slicers 210B, the speculative tap 220B, the decoder 230B, and the feedback generator 240B are omitted or disabled and the speculative tap 220A operates according to the previous speculative tap output signal 225A. For another example, the apparatus 200 employs a quarter-clock rate architecture by employing additional adders, additional sets of slicers, additional speculative taps, additional decoders, and additional feedback generators.

Figure 3:
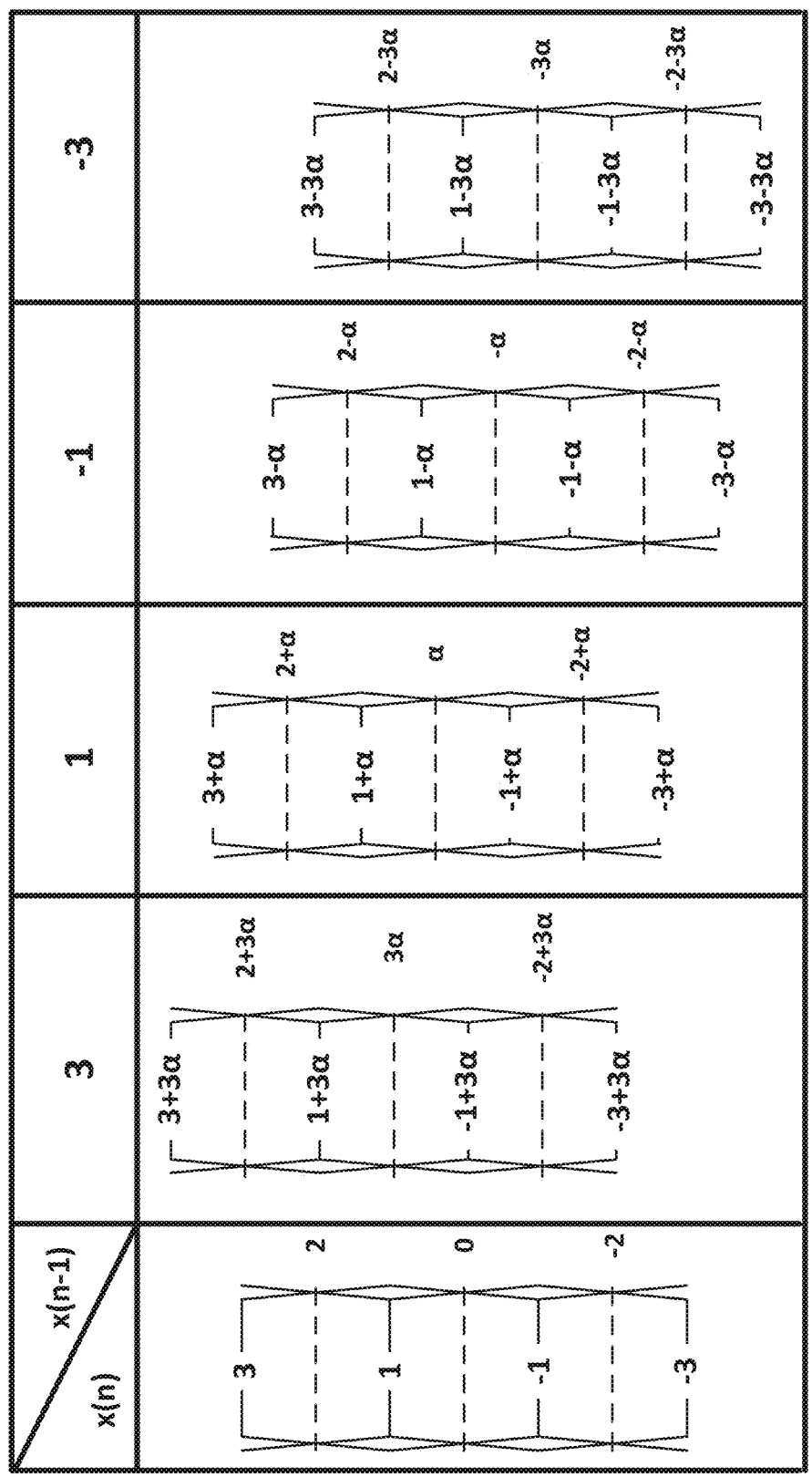
FIG. 3 is a diagram depicting example PAM4 signals.

Referring to FIG. 3, illustrated is a diagram depicting example PAM4 signals. In some embodiments, an input signal 202 is represented as one of four available levels. In some embodiments, a previous symbol of an input signal distorts a subsequent symbol of the input signal. By modeling an effect of a previous symbol as a, modified input signal for a non-zero tap1 is expressed according to the following equation:

$$y(n)=x(n)+\alpha x(n-1)$$

where y(n) is the input signal 202 received by the apparatus 200, x(n) is a signal transmitted by a transmitter (e.g., communication device 110A) at symbol n, x(n−1) is the signal transmitted by the transmitter at a previous symbol n−1, and a is a coefficient modeling an effect (e.g., ISI) of the previous symbol n−1 on the symbol n. As shown in FIG. 3, in some embodiments, the total available number of levels of the input signal 202 is 16, where 12 threshold values are employed to distinguish different levels for a given previous symbol n−1.

Figure 4:
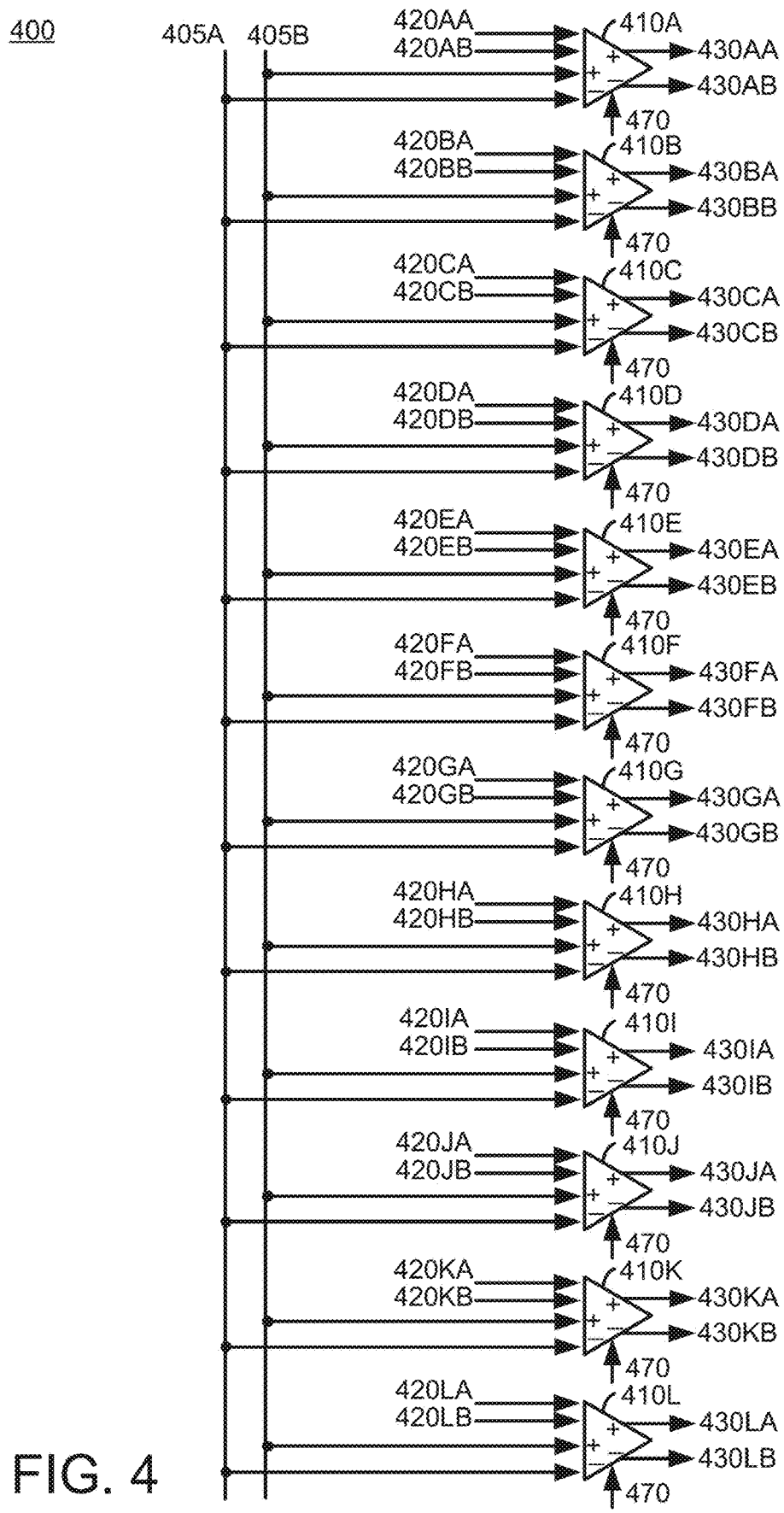
FIG. 4 is a diagram depicting a set of slicers.

Referring to FIG. 4, illustrated is a schematic diagram depicting a set of slicers 400. In some embodiments, the set of slicers 400 includes slicers 410A, 410B . . . 410L, where each slicer 410X has i) input ports to receive the input signals 405A, 405B, ii) reference ports to receive reference signals 420XA, 420XB, iii) a clock port to receive a clock signal 470, and iv) output ports to output bits 430XA, 430XB. In one example, L is 12 for PAM4 DFE application. In one aspect, the input signals 405A, 405B are PAM4 signals, and each slicer 410 generates differential bits 430XA, 430XB of the slicer output signals indicating whether a voltage difference of the input signals 405A, 405B is greater than or less than a voltage difference of reference signals 420XA, 420XB according to a pulse of the clock signal 470. In some embodiments, the set of slicers 400 is implemented as the set of slicers 210A or the set of slicers 210B. In case the set of slicers 400 is implemented as the set of slicers 210A of FIG. 2, the input signals 405A, 405B correspond to the modified input signal 205A, for example, in a differential representation, the clock signal 470 corresponds to the clock signal CLK, and a set of bits 430AA, 430BA, 430CA . . . 430LA and a set of bits 430AB, 430BB, 430CB . . . 430LB correspond to a differential representation of the slicer output signal 215A of FIG. 2.

In some embodiments, the reference signals 420XA, 420XB are predetermined according to a corresponding threshold value of the PAM4 signal. For example, a voltage difference of the reference signals 420AA, 420AB of a slicer 410A corresponds to 2+3α, a voltage difference of the reference signals 420BA, 420BB of a slicer 410B corresponds to 2+α, a voltage difference of reference signals 420CA, 420CB of a slicer 410C corresponds to 2−α, and a voltage difference of reference signals 420DA, 420DB of a slicer 410D corresponds to 2−3α. For example, a voltage difference of reference signals 420EA, 420EB of a slicer 410E corresponds to 3α, a voltage difference of reference signals 420FA, 420FB of a slicer 410F corresponds to α, a voltage difference of reference signals 420GA, 420GB of a slicer 410G corresponds to −α, and a voltage difference of reference signals 420HA, 420HB of a slicer 410H corresponds to −3α. For example, a voltage difference of reference signals 420IA, 420IB of a slicer 410I corresponds to −2+3α, a voltage difference of reference signals 420JA, 420JB of a slicer 410J corresponds to −2+α, a voltage difference of reference signals 420KA, 420KB of a slicer 410K corresponds to −2−α, and a voltage difference of reference signals 420LA, 420LB of a slicer 410L corresponds to −2−3α.

In some embodiments, a first set of bits 430AA, 430BA, 430CA . . . 430LA indicates a voltage level of the input signal 405A in a digital representation, and a second set of bits 430AB, 430BB, 430CB . . . 430LB indicates a voltage level of the input signal 405B in a digital representation. In one example, if the voltage level of the input signal 405A corresponds to 1+3α, the first set of bits 430AA, 430BA, 430CA . . . 430LA represent '0000 1111 1111', because the voltage difference of the input signals 405A, 405B is higher than a voltage difference corresponding to 3α, but is less than a voltage difference corresponding to 2−3α. Similarly, in one example, if the voltage difference of the input signals 405A, 405B corresponds to 1−3α, the first set of bits 430AA, 430BA, 430CA . . . 430LA represent '0000 0001 1111', because the voltage difference of the input signals 405A, 405B is higher than a voltage difference corresponding to −3α, but is less than a voltage difference corresponding to −α.

Although each slicer 410 operates according to a voltage difference of reference signals, in other embodiments, each slicer 410 operates according to a corresponding single reference voltage.

Figure 5:
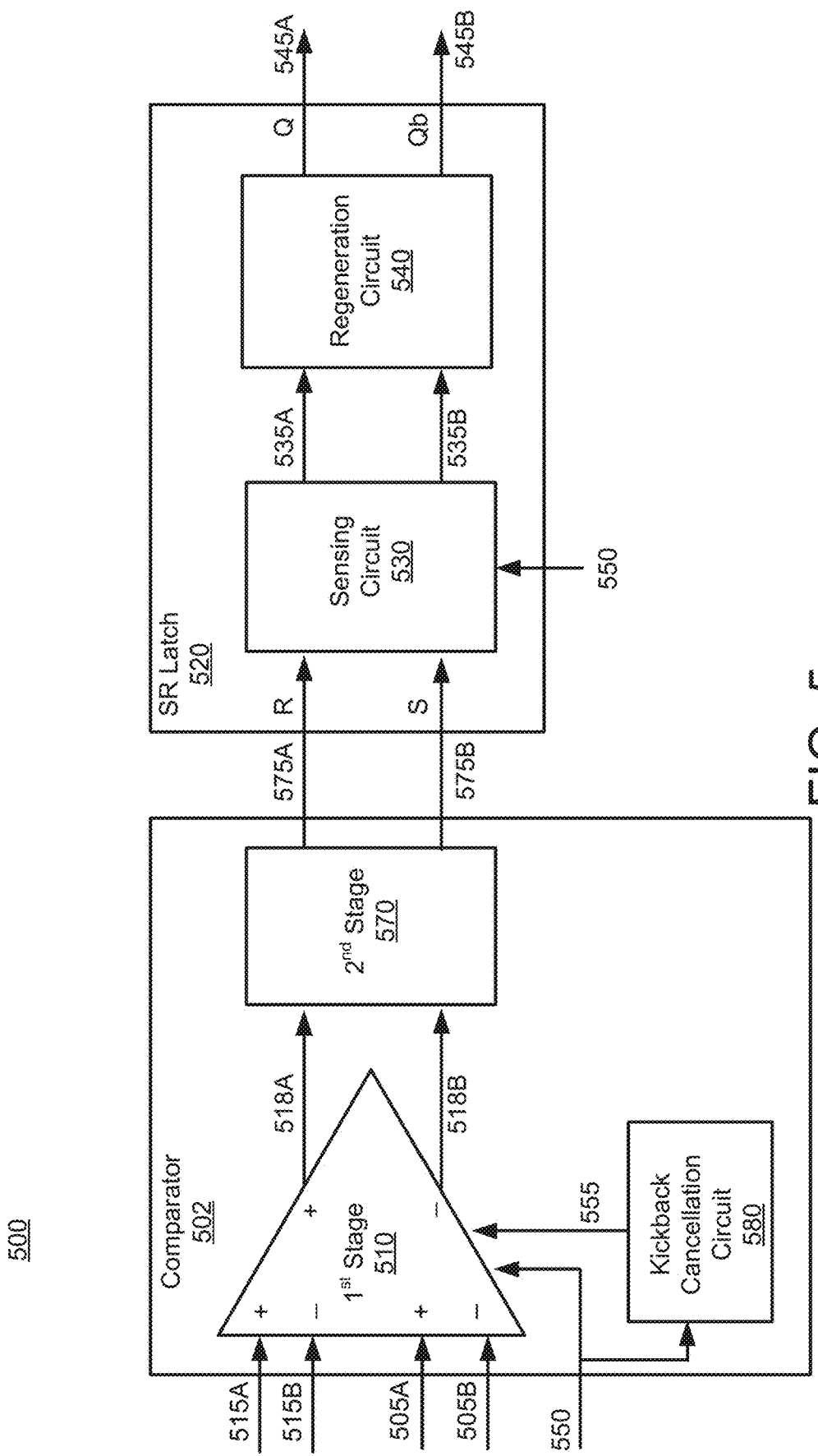
FIG. 5 is a diagram depicting an example slicer.

Referring to FIG. 5, illustrated is a schematic diagram depicting an example slicer 500. In some embodiments, a slicer 500 includes a comparator 502 (also referred to as "a comparator circuit 502" herein), and an SR latch 520 (also referred to as "a SR latch circuit 520" herein). In one embodiment, the comparator 502 includes a first stage circuit 510, a second stage circuit 570, and a kickback cancellation circuit 580. These components operate together to receive the reference signals 515A, 515B, input signals 505A, 505B, and a clock signal 550, and generate slicer output signals 545A, 545B indicating whether the voltage difference of the input signals 505A, 505B exceed a voltage difference of the reference signals 515A, 515B. In some embodiments, the slicer 500 is implemented as the slicer 410 of FIG. 4. In one aspect, the slicer 500 receives the input signals 505A, 505B having a reduced amplitude (e.g., 150 mV), and generates the slicer output signals 545A, 545B having a larger amplitude (e.g., between 0V and supply voltage VDD) in a digital representation. In some embodiments, the input signals 505A, 505B correspond to the input signals 405A, 405B of FIG. 4, the clock signal 550 corresponds to the clock signal 470 of FIG. 4, the reference signals 515A, 515B correspond to the reference signals 420XA, 420XB, and the slicer output signals 545A, 545B correspond to the differential bits 430XA, 430XB of FIG. 4.

The first stage circuit 510 is a circuit that compares the input signals 505A, 505B with the reference signals 515A, 515B, according to a pulse of the clock signal 550. In one configuration, the first stage circuit 510 includes i) input ports to receive the input signals 505A, 505B, ii) reference ports to receive the reference signals 515A, 515B, iii) a clock port to receive the clock signal 550, iv) a delay clock port to receive the delayed clock signal 555, and v) output ports to supply output comparison signals 518A, 518B. In this configuration, the first stage circuit 510 performs a front end sensing of the input signals 505A, 505B with respect to the reference signals 515A, 515B. In some embodiments, the first stage circuit 510 compares a voltage difference of the input signals 505A, 505B with a voltage difference of the reference signals 515A, 515B at the reference ports according to a pulse of the clock signal 550, and generates the output comparison signals 518A, 518B indicating whether the voltage difference of the input signals 505A, 505B exceeds the voltage difference of the reference signals 515A, 515B.

In some embodiments, the first stage circuit 510 is configured to reset voltages at the output ports of the first stage circuit 510, in response to a state (e.g., low state, logic '0' or 0V) of the clock signal 550. In some embodiments, the first stage circuit 510 charges the output ports of the first stage circuit 510, in response to a state (e.g., low state, logic '0' or 0V) of the clock signal 550. Moreover, the first stage circuit 510 discharges the output ports of the first stage circuit 510 at different rates according to i) a first voltage difference between the input signals 505A, 505B and ii) a second voltage difference between the reference signals 515A, 515B, in response to a state (e.g., high state, or logic '1' or VDD) of the clock signal 550. Detailed implementation and operation of the first stage circuit 510 are provided below with respect to FIGS. 6 and 9A.

In one aspect, the kickback cancellation circuit 580 performs a clock kickback compensation. In some embodiments, the kickback cancellation circuit 580 includes i) an input port to receive the clock signal 550 and ii) an output port coupled to the delayed clock port of the first stage circuit 510. In some embodiments, the kickback cancellation circuit 580 includes delay circuits that delay the clock signal 550 to obtain the delayed clock signal 555 and to inject the delayed clock signal 555 to the delayed clock port of the first stage circuit 510. Without the kickback cancellation circuit 580, a pulse of the clock signal 550 degrades the input signals, the output signals, or a combination of the input signals and the output signals of the first stage circuit 510, for example, through a parasitic coupling. By employing the kickback cancellation circuit 580 that injects the delayed clock signal 555 to the first stage circuit 510, degradation due to the parasitic coupling of the pulse of the clock signal is mitigated, in some embodiments. Accordingly, sensitivity of the first stage circuit 510 is improved through the clock kickback compensation.

In some embodiments, the second stage circuit 570 includes i) input ports coupled to output ports of the first stage circuit 510 and ii) output ports. In some embodiments, the second stage circuit 570 performs amplification or regeneration on the output comparison signals 518A, 518B. In one aspect, the second stage circuit 570 senses a voltage difference of the output comparison signals 518A, 518B, and generates comparator output signals 575A, 575B indicating which of the output comparison signals 518A, 518B is higher. In some embodiments, the comparator output signals 575A, 575B are pulses swinging between 0V and supply voltage VDD, where 0V corresponds to logic value 0 and supply voltage VDD corresponds to logic value '1' (or high state). In one aspect, the second stage circuit 570 generates comparator output signals 575A, 575B according to the following table:

| | State of comparator output signal 575A | State of comparator output signal 575B |
|---|---|---|
| If output comparison signals 518A, 518B are equal | 0 | 0 |
| If output comparison signal 518A > output comparison signal 518B (or output comparison signal 518B discharges faster) | 1 | 0 |
| If output comparison signal 518B > output comparison signal 518A (or output comparison signal 518A discharges faster) | 0 | 1 |

Accordingly, the second stage circuit 570 generates comparator output signals 575A, 575B indicating whether the voltage difference of the input signals 505A, 505B exceeds the voltage difference of the reference signals 515A, 515B, and outputs the comparator output signals 575A, 575B to the SR latch 520, in some embodiments.

In some embodiments, the SR latch 520 includes a sensing circuit 530 and a regeneration circuit 540. In one configuration, the sensing circuit 530 includes i) input ports coupled to output ports of the second stage circuit 570, ii) a clock port, and iii) output ports. In one configuration, the regeneration circuit 540 includes i) input ports coupled to the output ports of the sensing circuit 530, and ii) output ports. In this configuration, the sensing circuit 530 senses a voltage difference between the comparator output signals 575A, 575B, in response to a pulse of the clock signal 550 to obtain sensed signals 535A, 535B, and outputs the sensed signals 535A, 535B at the output ports. Moreover, in this configuration, the regeneration circuit 540 amplifies the sensed signals 535A, 535B to obtain the slicer output signals 545A, 545B and output the slicer output signals 545A, 545B at the output ports. In one aspect, the SR latch 520 is implemented as complementary metal-oxide-semiconductor (CMOS) circuitries that perform faster sensing and amplification than conventional circuitries (e.g., CMOS NOR circuitries) with reduced hardware resources. Detailed implementation and operation of the SR latch 520 are provided below with respect to FIGS. 7, 8, and 9B.

Figure 6:
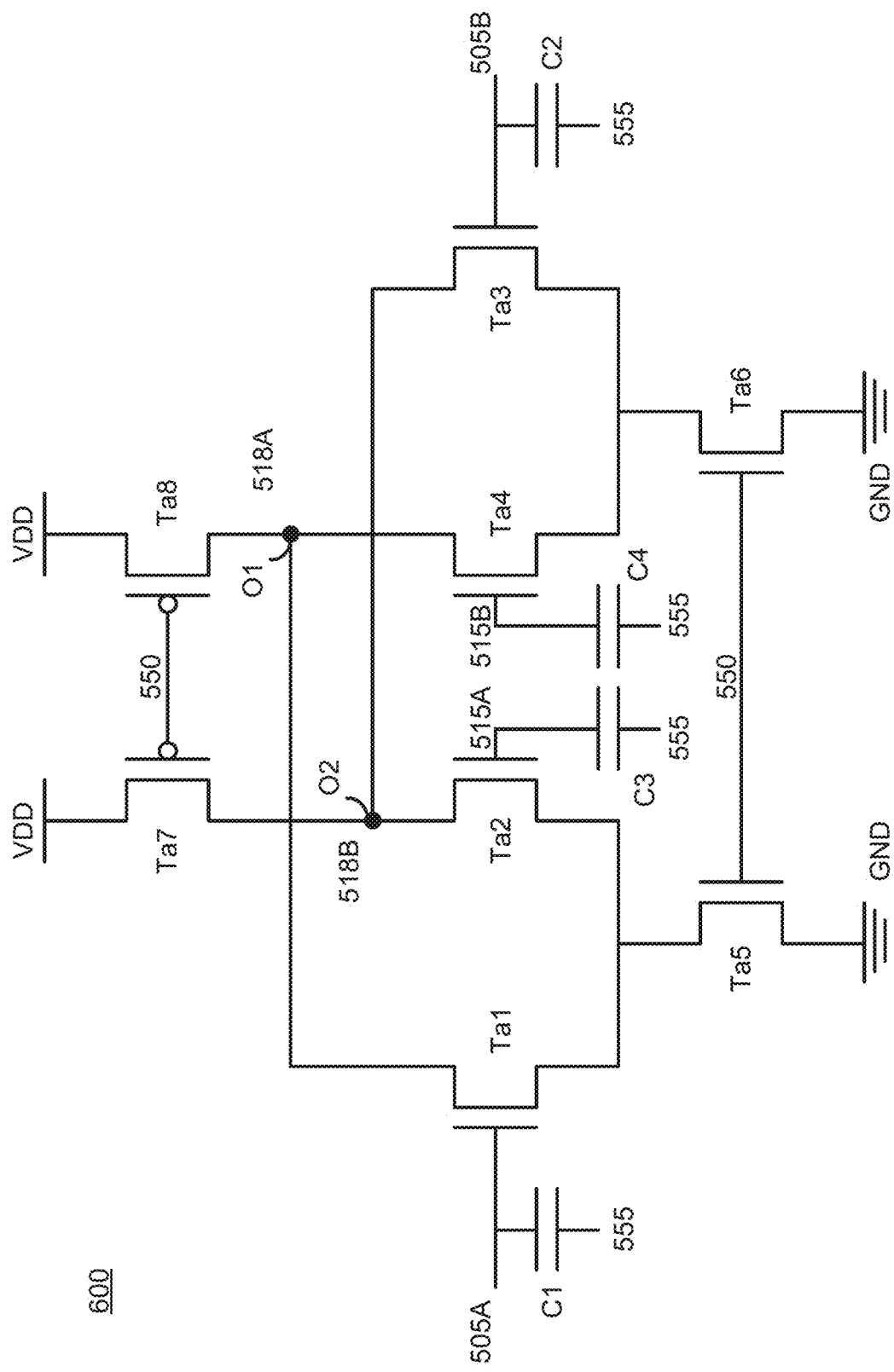
FIG. 6 is a diagram depicting an example first stage circuit of a comparator.

Referring to FIG. 6, illustrated is a schematic diagram depicting an example first stage circuit 600 of a comparator. In some embodiments, the first stage circuit 600 is implemented as the first stage circuit 510 of FIG. 5. In some embodiments, the first stage circuit 600 includes transistors Ta1, Ta2, Ta3, Ta4, Ta5, Ta6, Ta7, Ta8. In some embodiments, the first stage circuit 600 includes or is coupled to capacitors C1, C2, C3, C4. In some embodiments, the capacitors C1, C2, C3, C4 are implemented as metal oxide semiconductor (MOS) capacitors or metal oxide metal (MOM) capacitors. In some embodiments, the capacitors C1, C2, C3, C4 are implemented as part of the kickback cancellation circuit 580, or are coupled between the first stage circuit 600 of a comparator and the kickback cancellation circuit 580. These components operate together to receive input signals 505A, 505B, a clock signal 550, and a delayed clock signal 555, compare the input signals 505A, 505B with reference signals 515A, 515B, and generate comparison signals 518A, 518B according to the comparison and a pulse of the clock signal 550. In some embodiments, the delayed clock signal 555 is injected to perform clock kickback compensation. In other embodiments, the first stage circuit 600 of a comparator includes more, fewer, or different components than shown in FIG. 6. In some embodiments, the transistors Ta1, Ta2, Ta3, Ta4, Ta5, Ta6 are N-type transistors (e.g., NMOS) and the transistors Ta7, Ta8 are P-type transistors (e.g., PMOS). In other embodiments, the transistors Ta1, Ta2, Ta3, Ta4, Ta5, Ta6, Ta7, Ta8 are implemented with different types of transistors than shown in FIG. 6.

In one configuration, the transistor Ta1 includes i) a gate electrode, ii) a source electrode, and iii) a drain electrode. In one configuration, the transistor Ta2 includes i) a gate electrode, ii) a source electrode coupled to the source electrode of the Ta1, and iii) a drain electrode. In one configuration, the transistor Ta3 includes i) a gate electrode, ii) a source electrode, and iii) a drain electrode coupled to the drain electrode of the transistor Ta2. In one configuration, the transistor Ta4 includes i) a gate electrode, ii) a source electrode coupled to the source electrode of the transistor Ta3, and iii) a drain electrode coupled to the drain electrode of the transistor Ta1. In one configuration, the transistor Ta5 includes i) a gate electrode, ii) a source electrode coupled to a first supply port (e.g., a ground port), and iii) a drain electrode coupled to the source electrodes of the transistors Ta1, Ta2. In one configuration, the transistor Ta6 includes i) a gate electrode, ii) a source electrode coupled to the first supply port, and iii) a drain electrode coupled to the source electrodes of the transistors Ta3, Ta4. In one configuration, the transistor Ta7 includes i) a gate electrode, ii) a source electrode coupled to a second supply port (e.g., a VDD port), and iii) a drain electrode coupled to the drain electrodes of the transistors Ta2, Ta3. In one configuration, the transistor Ta8 includes i) a gate electrode coupled to the gate electrode of the transistor Ta7, ii) a source electrode coupled to the second supply port, and iii) a drain electrode coupled to the drain electrodes of the transistors Ta1, Ta4. In some embodiments, the drain electrodes of the transistors Ta1, Ta4, Ta8 are coupled to an output port O1 of the first stage circuit 600, and the drain electrodes of the transistors Ta2, Ta3, Ta7 are coupled to an output port O2 of the first stage circuit 600.

In this configuration, the transistor Ta1 receives the input signal 505A at the gate electrode, and the transistor Ta3 receives the input signal 505B at the gate electrode. In addition, the transistor Ta2 receives the reference signal 515A at the gate electrode, and the transistor Ta4 receives the reference signal 515B at the gate electrode. Moreover, the transistors Ta5, Ta6, Ta7, Ta8 receive the clock signal 550 at the gate electrodes. In one aspect, the first stage circuit 600 resets voltages at outputs ports O1, O2, in response to the clock signal 550 in a low state (e.g., logic '0' or 0V). In some embodiments, the first stage circuit 600 charges the outputs ports O1, O2, in response to the clock signal 550 in a low state (e.g., logic '0' or 0V). In one approach, the transistors Ta7, Ta8 are enabled and the transistors Ta5, Ta6 are disabled in response to a low state (e.g., logic '0' or 0V) of the clock signal 550, hence, voltages of the output ports O1, O2 are increased, for example, to a supply voltage VDD. In one approach, the transistors Ta7, Ta8 are disabled and the transistors Ta5, Ta6 are enabled in response to a high state (e.g., logic '1' or VDD) of the clock signal 550, hence, voltages of the output ports O1, O2 are decreased, for example, to 0V. In one approach, a rate of discharge changes according to the input signals 505A, 505B with respect to the reference signals 515A, 515B. For example, if a voltage difference of the input signals 505A, 505B is higher than a voltage difference of the reference signals 515A, 515B, then the output port O1 is discharged faster than the output port O2.

In one aspect, a pulse of the clock signal 550 degrades the input signal, the output signal, or a combination of the input signal and the output signal of the first stage circuit 600, for example, through a parasitic coupling. For example, in one aspect, the clock signal 550 applied to the gate electrodes of the transistors Ta5, Ta6, Ta7, Ta8 propagates through parasitic capacitors (e.g., Cgs or Cgd) of the transistors Ta1-Ta8, thereby degrading the sensitivity of the first stage circuit 600.

In some embodiments, by injecting the delayed clock signal 555 at input ports or gate electrodes of the transistors Ta1, Ta2, Ta3, Ta4, degradation due to the parasitic coupling of the clock signal 550 is mitigated. In some embodiments, the first stage circuit 600 includes or is coupled to capacitors C1, C2, C3, C4 for injecting the delayed clock signal 555. In some embodiments, the capacitors C1, C2, C3, C4 have the substantially same capacitance. In one implementation, a first electrode of the capacitor C1 is coupled to the gate electrode of the transistor Ta1 and a second electrode of the capacitor C1 is coupled to the output port of the kickback cancellation circuit 580. Similarly, in one implementation, a first electrode of the capacitor C2 is coupled to the gate electrode of the transistor Ta3 and a second electrode of the capacitor C2 is coupled to the output port of the kickback cancellation circuit 580. Similarly, in one implementation, a first electrode of the capacitor C3 is coupled to the gate electrode of the transistor Ta2, and a second electrode of the capacitor C3 is coupled to the output port of the kickback cancellation circuit 580. Furthermore, in one implementation, a first electrode of the capacitor C4 is coupled to the gate electrode of the transistor Ta4, and a second electrode of the capacitor C4 is coupled to the output port of the kickback cancellation circuit 580. In this configuration, the delayed clock signal 555 is supplied through the capacitors C1, C2, C3, C4. In one approach, the delayed clock signal 555 is delayed from the clock signal 550 by a time delay for the clock signal 550 to propagate to source electrodes, drain electrodes, or a combination of the source electrodes and the drain electrodes of the transistors Ta1, Ta2, Ta3, Ta4 through parasitic capacitors, such that the transistors Ta1, Ta2, Ta3, Ta4 conduct or discharge according to the input signals 505A, 505B with reduced influence from the clock signal 550.

In some embodiments, the input impedances at the input ports of the first stage circuit 600 (or gate electrodes of the transistors Ta1, Ta2, Ta3, Ta4) are matched to ensure the delayed clock signal 555 is supplied to the input ports of the first stage circuit 600 simultaneously.

Figure 7:
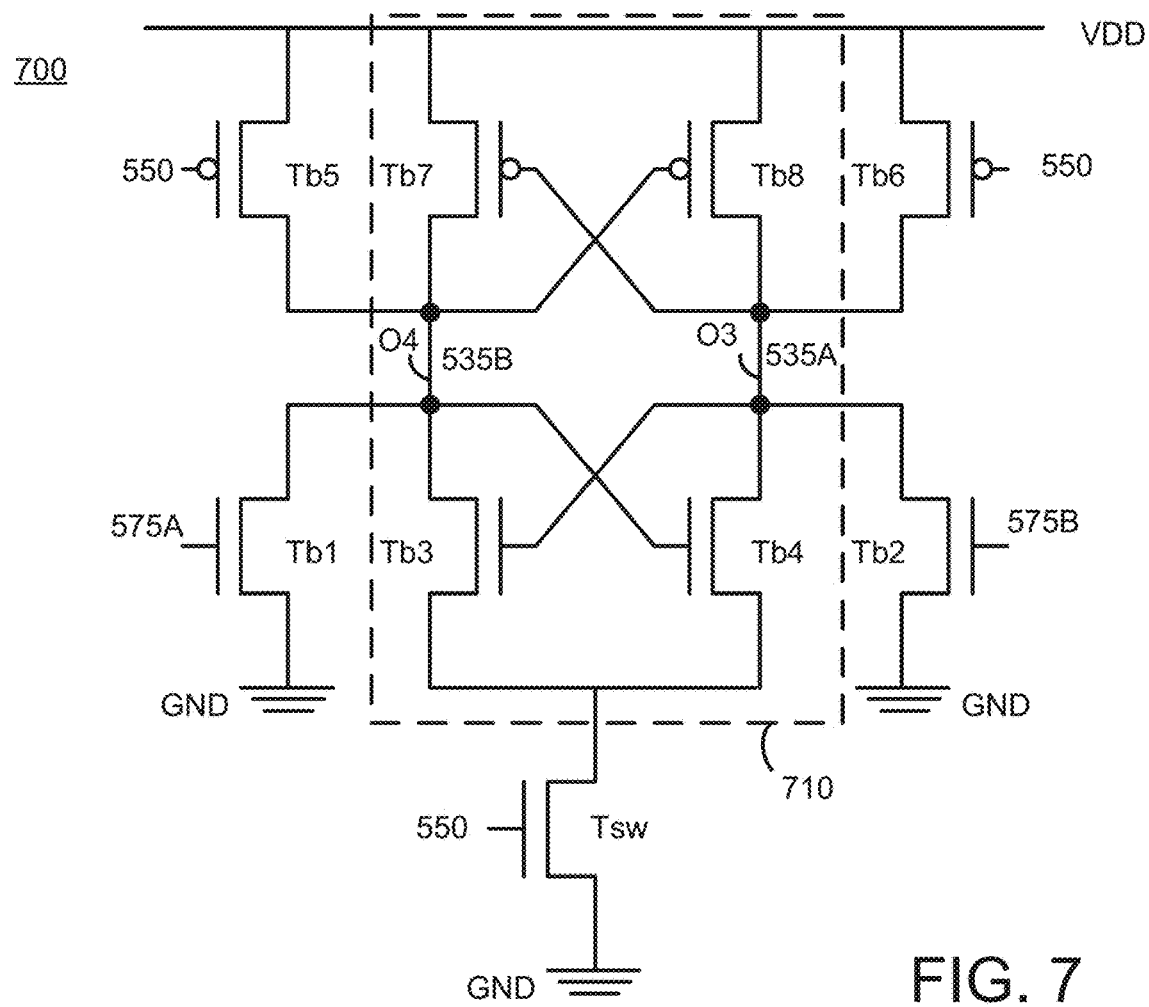
FIG. 7 is a diagram depicting an example sensing circuit.

Referring to FIG. 7, illustrated is a diagram depicting an example sensing circuit 700. In some embodiments, the sensing circuit 700 is implemented as the sensing circuit 530 of FIG. 5. In some embodiments, the sensing circuit 700 includes transistors Tb1, Tb2, Tb3, Tb4, Tb5, Tb6, Tb7, Tb8, Tsw. These components operate together to receive comparator output signals 575A, 575B, and a clock signal 550, and amplify a voltage difference of the comparator output signals 575A, 575B to generate sensed signals 535A, 535B. In other embodiments, the sensing circuit 700 includes more, fewer, or different components than shown in FIG. 7. In some embodiments, the transistors Tb1, Tb2, Tb3, Tb4, Tsw are N-type transistors (e.g., NMOS) and the transistors Tb5, Tb6, Tb7, Tb8 are P-type transistors (e.g., PMOS). In other embodiments, the transistors Tb1, Tb2, Tb3, Tb4, Tb5, Tb6, Tb7, Tb8, Tsw are implemented with different types of transistors than shown in FIG. 7.

In one configuration, the transistor Tb1 includes i) a gate electrode coupled to a first input port of the sensing circuit 700, ii) a source electrode coupled to the first supply port (e.g., GND port), and iii) a drain electrode. In one configuration, the transistor Tb2 includes i) a gate electrode coupled to a second input port of the sensing circuit 700, ii) a source electrode coupled to the first supply port, and iii) a drain electrode. In one configuration, the transistor Tb3 includes i) a gate electrode coupled to the drain electrode of the transistor Tb2, ii) a source electrode, and iii) a drain electrode coupled to the drain electrode of the transistor Tb1. In one configuration, the transistor Tb4 includes i) a gate electrode coupled to the drain electrode of the transistor Tb1, ii) a source electrode coupled to the source electrode of the transistor Tb3, and iii) a drain electrode coupled to the drain electrode of the transistor Tb2. In one configuration, the transistor Tb5 includes i) a gate electrode, ii) a source electrode coupled to a second supply port (e.g., a VDD port), and iii) a drain electrode coupled to the drain electrode of the transistor Tb1. In one configuration, the transistor Tb6 includes i) a gate electrode, ii) a source electrode coupled to the second supply port, and iii) a drain electrode coupled to the drain electrode of the transistor Tb2. In one configuration, the transistor Tb7 includes i) a gate electrode coupled to the drain electrode of the transistor Tb2, ii) a source electrode coupled to the second supply port, and iii) a drain electrode coupled to the drain electrode of the transistor Tb1. In one configuration, the transistor Tb8 includes i) a gate electrode coupled to the drain electrode of the transistor Tb1, ii) a source electrode coupled to the second supply port, and iii) a drain electrode coupled to the drain electrode of the transistor Tb2. In one configuration, the transistor Tsw includes i) a gate electrode, ii) a source electrode coupled to the first supply port, and iii) a drain electrode coupled to the source electrodes of the transistors Tb3, Tb4. In some embodiments, the drain electrodes of the transistors Tb2, Tb4, Tb6, Tb8 are coupled to an output port O3 of the sensing circuit 700, and the drain electrodes of the transistors Tb1, Tb3, Tb5, Tb7 are coupled to an output port O4 of the sensing circuit 700.

In this configuration, the transistors Tb3, Tb4, Tb7, Tb8 form cross-coupled transistors 710, strength of which are increased or decreased according to the switch transistor Tsw. In one example, the transistor Tb1 receives the comparator output signal 575A at the gate electrode, and the transistor Tb2 receives the comparator output signal 575B at the gate electrode. In addition, the transistors Tb5, Tb6, Tsw receive the clock signal 550 at the gate electrodes.

In one aspect, the sensing circuit 700 resets voltages at outputs ports O3, O4, in response to a low state (e.g., logic '0' or 0V) of the clock signal 550. In some embodiments, the sensing circuit 700 charges the outputs ports O3, O4, in response to the low state (e.g., logic '0' or 0V) of the clock signal 550. In one approach, the transistors Tb5, Tb6 are enabled and current does not flow through the transistors Tb3, Tb4, in response to a low state (e.g., logic '0' or 0V) of the clock signal 550, hence the strength of regeneration by the cross-coupled transistors 710 is reduced. In one approach, the transistors Tb5, Tb6 are disabled and current flows through either the transistors Tb3, Tb4 or a combination of the transistors Tb3, Tb4, in response to a high state (e.g., logic '1' or VDD) of the clock signal 550, hence the strength of regeneration by the cross-coupled transistors 710 is increased. In one aspect, a voltage difference between the comparator output signals 575A, 575B is sensed in response to a pulse of the clock signal 550 in the high state, and the sensed voltage difference is amplified. In one approach, in response to the clock signal 550 in the high state, the sensing circuit 700 performs sensing by discharging the output ports O3, O4 at different rates according to the comparator output signals 575A, 575B. For example, if a voltage of the comparator output signal 575A is higher than a voltage of the comparator output signal 575B, then the output port O4 is discharged faster than the output port O3 such that the voltage of the sensed signal 535A becomes higher than the voltage of the sensed signal 535B.

Figure 8:
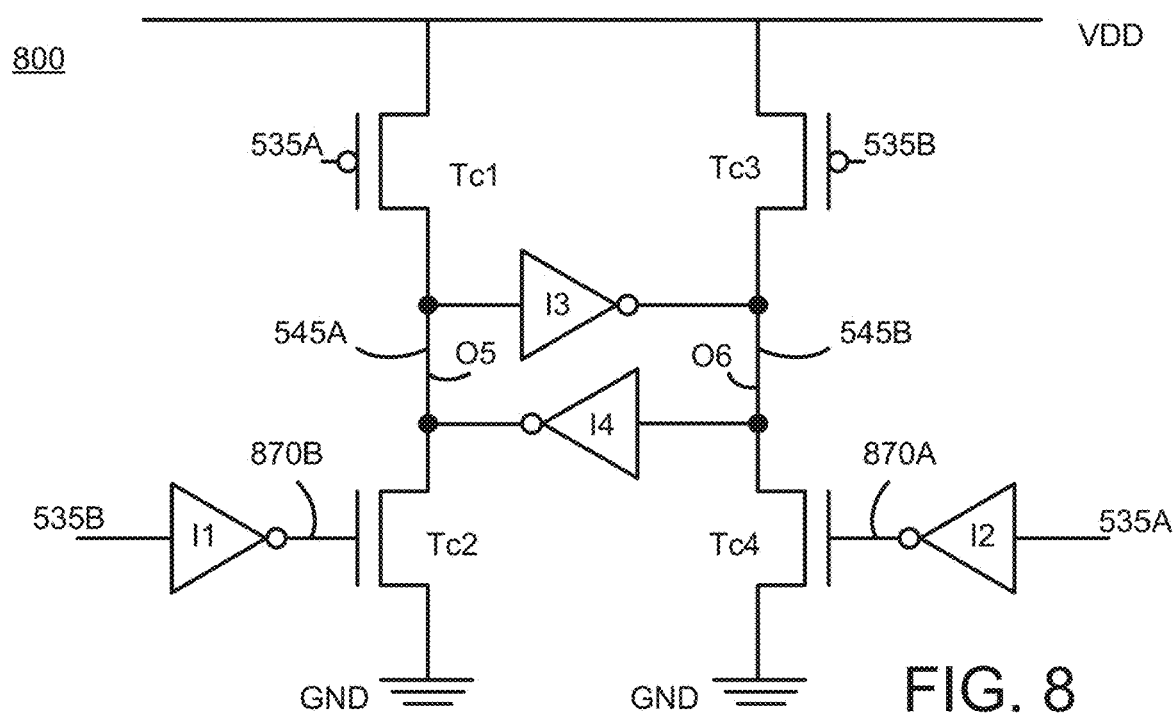
FIG. 8 is a diagram depicting an example regeneration circuit.

Referring to FIG. 8, illustrated is a schematic diagram depicting an example regeneration circuit 800. In some embodiments, the regeneration circuit 800 is implemented as the regeneration circuit 540 of FIG. 5. In some embodiments, the regeneration circuit 800 includes transistors Tc1, Tc2, Tc3, Tc4, and inverters I1, I2, I3, I4. These components operate together to receive sensed signals 535A, 535B, and amplify a voltage difference of the sensed signals 535A, 535B to generate slicer output signals 545A, 545B. In other embodiments, the regeneration circuit 800 includes more, fewer, or different components than shown in FIG. 8. In some embodiments, the transistors Tc2, Tc4 are N-type transistors (e.g., NMOS) and the transistors Tc1, Tc3 are P-type transistors (e.g., PMOS). In other embodiments, the transistors Tc1, Tc2, Tc3, Tc4 are implemented with different types of transistors than shown in FIG. 8.

In one configuration, the transistor Tc1 includes i) a gate electrode coupled to the output port O3 of the sensing circuit 700, ii) a source electrode coupled to the second supply port (e.g., VDD port), and iii) a drain electrode. In one configuration, the transistor Tc3 includes i) a gate electrode coupled to the output port O4 of the sensing circuit 700, ii) a source electrode coupled to the second supply port, and iii) a drain electrode. In one configuration, the inverter I1 includes an input port coupled to the output port O4 of the sensing circuit 700, and the inverter I2 includes an input port coupled to the output port O3 of the sensing circuit 700. In one configuration, the transistor Tc2 includes i) a gate electrode coupled to the output port of the inverter I1, ii) a source electrode coupled to the first supply port (e.g., GND port), and iii) a drain electrode coupled to the drain electrode of the transistor Tc1. In one configuration, the transistor Tc4 includes i) a gate electrode coupled to the output port of the inverter I2, ii) a source electrode coupled to the first supply port, and iii) a drain electrode coupled to the drain electrode of the transistor Tc3. In one configuration, the inverters I3 and I4 form cross-coupled inverters between the output ports O5, O6 of the regeneration circuit 800.

In some embodiments, the transistor Tc1 receives the sensed signal 535A at the gate electrode, and the transistor Tc3 receives the sensed signal 535B at the gate electrode. In some embodiments, the inverter I2 receives the sensed signal 535A at the input port, and the inverter I1 receives the sensed signal 535B at the input port. Moreover, in some embodiments, the transistor Tc2 receives an inverted sensed signal 870B having an inverted phase of the sensed signal 535B at the gate electrode, and the transistor Tc4 receives an inverted sensed signal 870A having an inverted phase of the sensed signal 535A at the gate electrode.

In one aspect, the transistors Tc1, Tc2, Tc3, Tc4 receive the sensed signals from the sensing circuit 700, and amplify the received signals through the positive feedback by the cross-coupled inverters I3, I4. In one approach, the regeneration circuit 800 holds the voltages at the output ports O5, O6, while the clock signal 550 is in a low state such that a voltage difference at the output ports O3, O4 is not strong enough to override voltages at the output ports O5, O6 held by the cross-coupled inverters I3, I4. In one approach, the regeneration circuit 800 changes the voltages at the output ports O5, O6 according to the voltages at the output ports O3, O4 of the sensing circuit 700, while the clock signal 550 is in a high state because a voltage difference at the output ports O3, O4 is strong enough to override voltages at the output ports O5, O6 held by the cross-coupled inverters I3, I4. Although the comparator output signals 575A, 575B are not fully differential, the inverters I1, I2 enable regeneration circuit 800 to operate with inverted sensed signals 870A, 870B.

In one aspect, the sensing circuit 700 and the regeneration circuit 800 are implemented as complementary metal oxide semiconductor (CMOS) circuitries that perform faster sensing and amplification than conventional circuitries (e.g., current mode logic (CML) or CMOS NOR circuitries) in a smaller form factor.

Figure 9A:
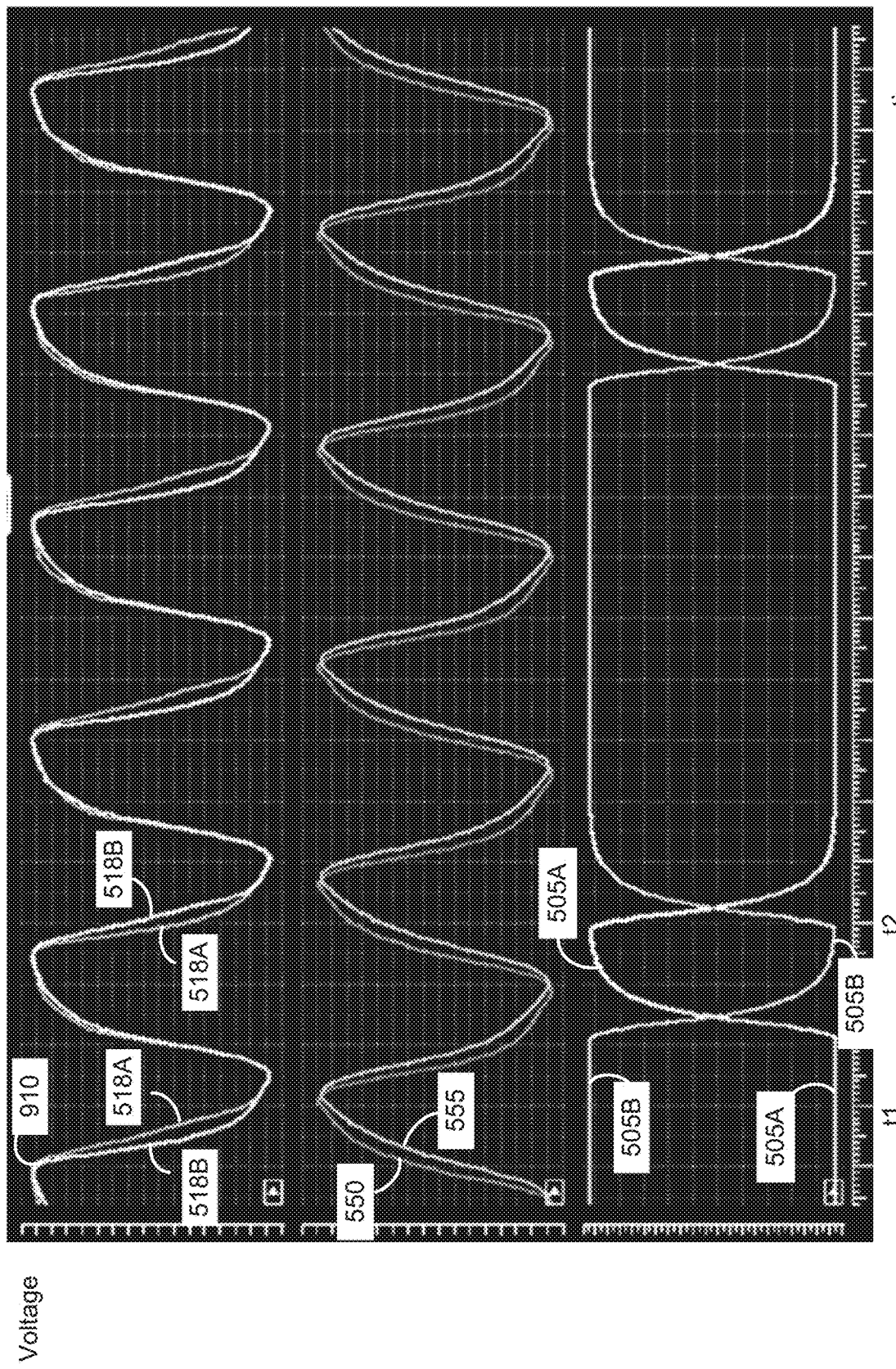
FIG. 9A is a timing diagram depicting an example operation of a comparator.

Referring to FIG. 9A, illustrated is a timing diagram depicting an example operation of the first stage circuit 510 of the comparator 502 of FIG. 5. In one example, in response to a low state of the clock signal 550, the first stage circuit 510 charges the output ports, such that the comparison signals 518A, 518B are at VDD. In response to the clock signal 550 in a high state, the first stage circuit 510 discharges the output ports of the first stage circuit 510 at different rates according to the input signals 505A, 505B. For example, at time t1, a voltage of the input signal 505A is lower than a voltage of the input signal 505B, thus a voltage of the comparison signal 518B becomes less than a voltage of the comparison signal 518A, because the first stage circuit 510 discharges the output port O2 faster than the output port O1. For example, at time t2, a voltage of the input signal 505A is higher than a voltage of the input signal 505B, thus a voltage of the comparison signal 518B becomes higher than a voltage of the comparison signal 518A, because the first stage circuit 510 discharges the output port O1 faster than the output port O2.

In one example, a peak to peak voltage of each of the input signals 505A, 505B is 150 mV, and a peak to peak voltage of each of the comparison signals 518A, 518B, the clock signal 550 and the delayed clock signal 555 is 800 mV (or VDD).

Figure 9B:
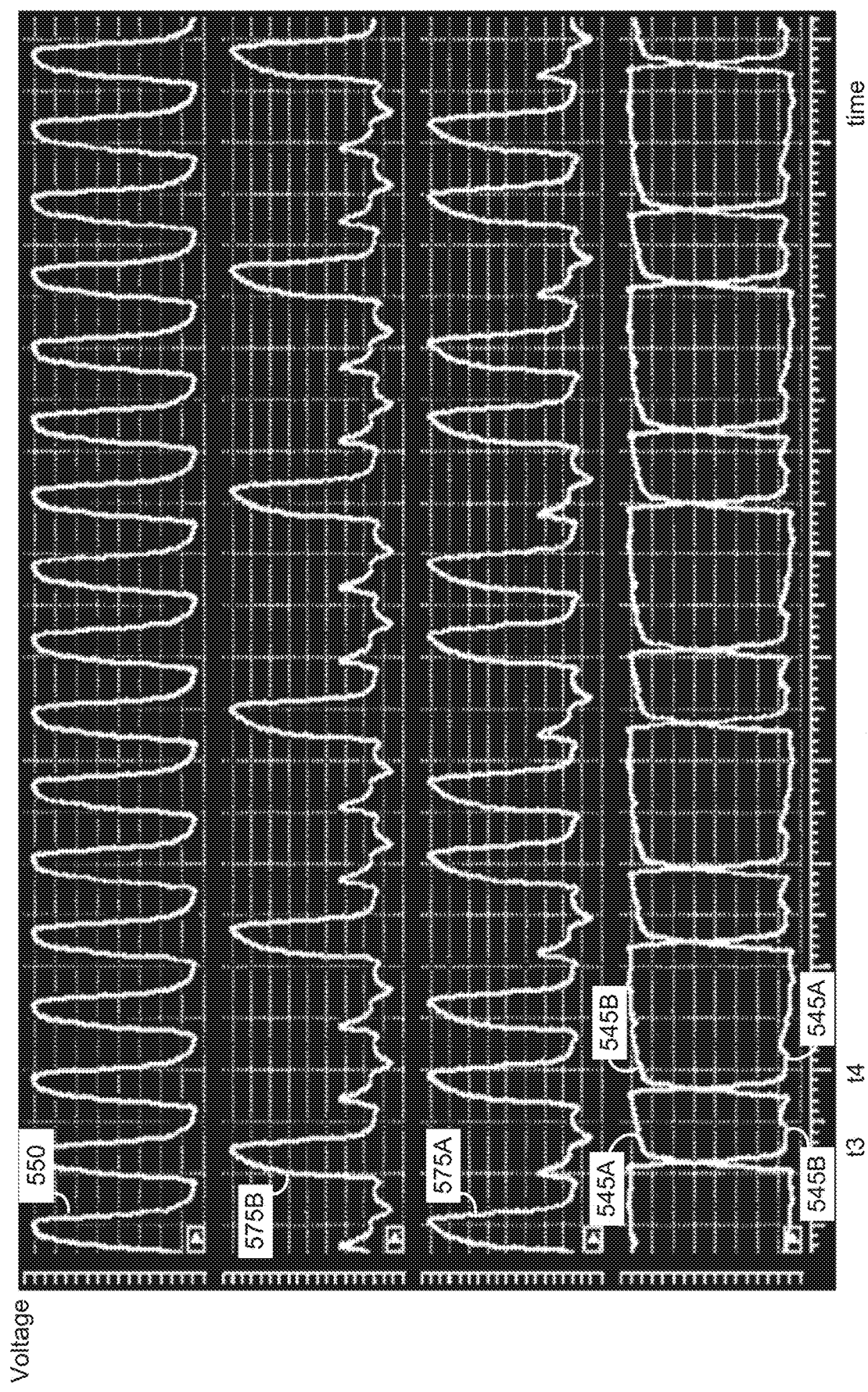
FIG. 9B is a timing diagram depicting an example operation of a SR latch.

Referring to FIG. 9B, illustrated is a timing diagram depicting an example operation of a SR latch 520. In one example, the SR latch 520 senses the comparator output signals 575A, 575B and amplifies the sensed signals to obtain slicer output signals 545A, 545B, in response to the clock signal. In one example, the SR latch 520 senses the comparator output signals 575A, 575B and amplifies the sensed signals, in response to the clock signal in a high state. In response to the clock signal in a low state, the SR latch 520 maintains voltages of the slicer output signals 545A, 545B. For example, at time t3, a voltage of the comparator output signal 575B is higher than a voltage of the comparator output signal 575A in response to the clock signal 550 in the high state, hence the SR latch 520 generates the slicer output signal 545A having a higher voltage than the slicer output signal 545B. The SR latch 520 maintains the slicer output signals 545A, 545B until a pulse of the comparator output signal 575A is detected. For example, at time t4, a voltage of the comparator output signal 575B is lower than a voltage of the comparator output signal 575A in response to the clock signal 550 in the high state, hence the SR latch 520 generates the slicer output signal 545A having a lower voltage than the slicer output signal 545B.

In one example, a peak to peak voltage of each of the clock signal 550, and the slicer output signals 545A, 545B is 800 mV (or VDD).

Figure 9C:
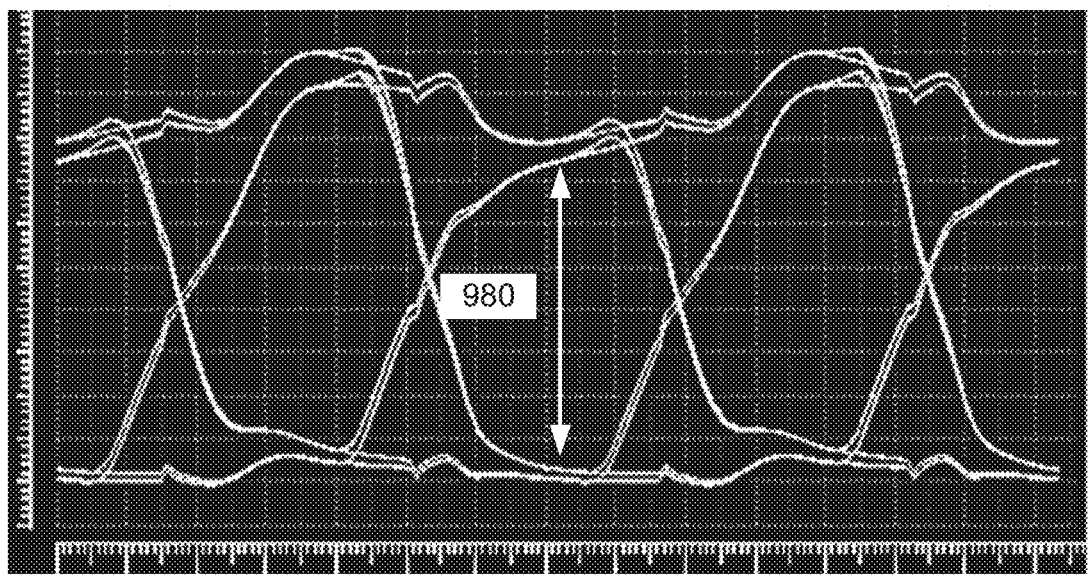
FIG. 9C is an eye diagram without a clock kickback compensation.
Figure 9D:
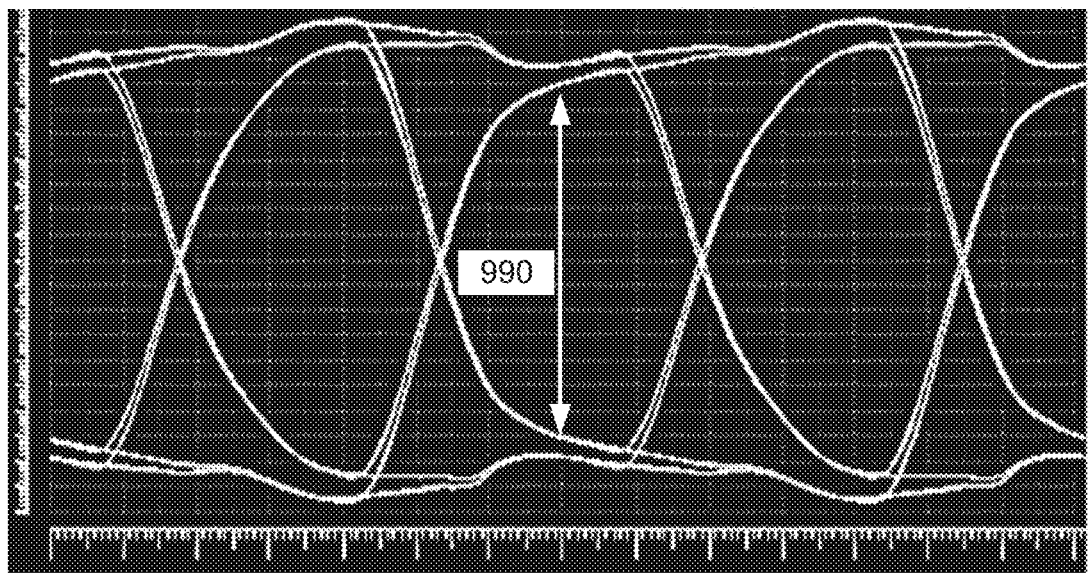
FIG. 9D is an eye diagram with a clock kickback compensation.

Referring to FIG. 9C, illustrated is an example eye diagram without a clock kickback compensation. Referring to FIG. 9D, illustrated is an example eye diagram with a clock kickback compensation. In one example, a delayed clock signal 555 is applied to perform clock kickback compensation. Without the clock kickback compensation, a pulse of the clock signal 550 degrades the input signal of the comparator 502, for example, through a parasitic coupling as shown in FIG. 9C. By injecting the delayed clock signal 555, distortions due to a pulse of the clock signal 550 propagated through parasitic capacitance are reduced. Hence, an eye opening 990 with the clock kickback compensation is improved compared to an eye opening 980 without the clock kickback compensation.

Figure 10:
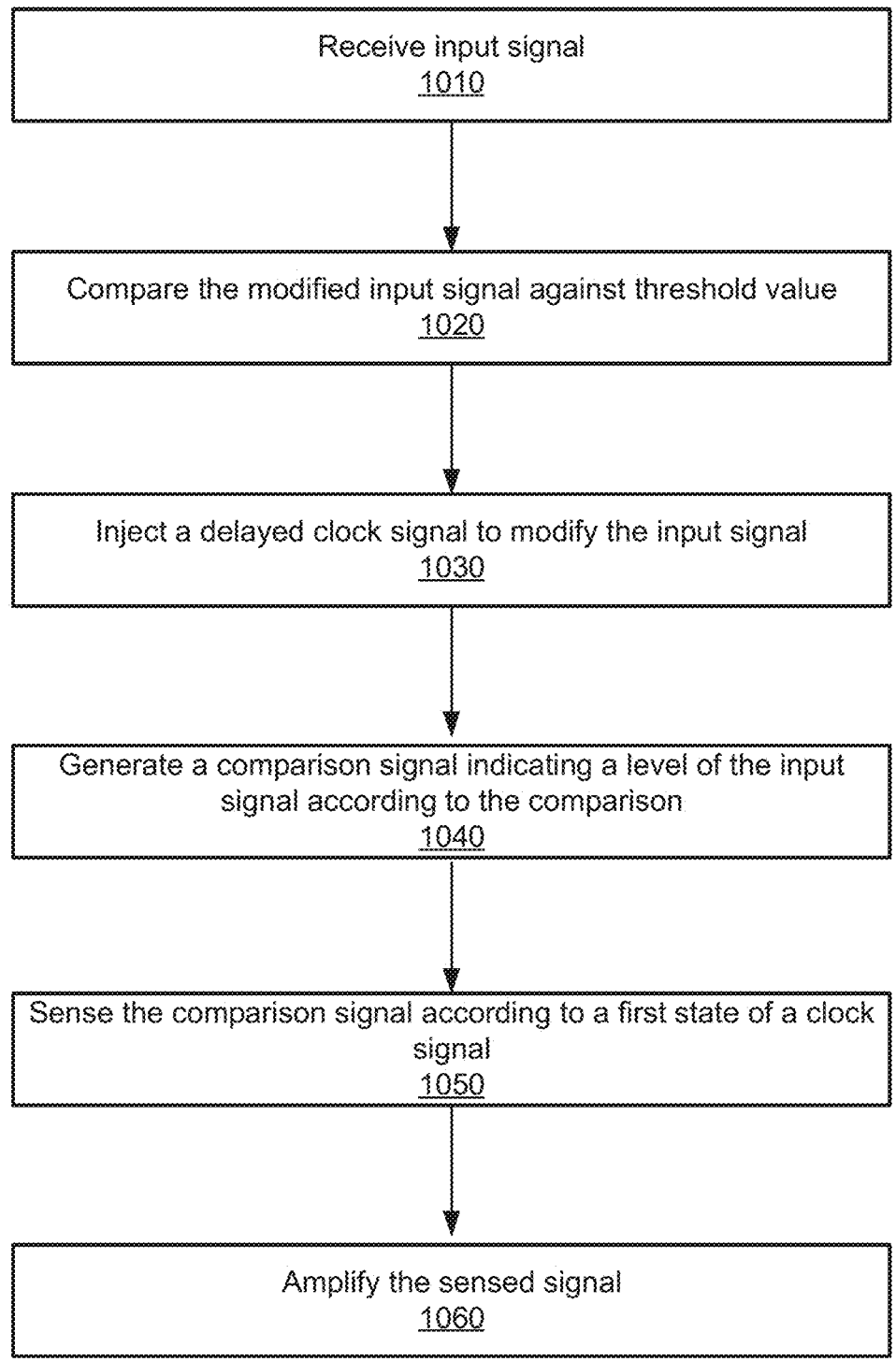
FIG. 10 is a flow chart depicting an example process of sensing an input signal with a clock kickback compensation.

Referring to FIG. 10, illustrated is a flow chart depicting an example process 1000 of sensing an input signal with a clock kickback compensation. In some embodiments, the process 1000 is performed by the slicer 500 of FIG. 5. In some embodiments, the process 1000 is performed by other entities. In some embodiments, the process 1000 includes more, fewer, or different steps than shown in FIG. 10.

In some embodiments, the slicer 500 receives 1010 an input signal. In some embodiments, the input signal is from another communication device 110. In some embodiments, the input signal conforms to a PAM4 protocol. In some embodiments, a feedback signal is added to the input signal to reduce ISI from an adjacent symbol.

In some embodiments, the slicer 500 compares 1020 the modified input signal against a threshold value (e.g., a voltage of a reference signal). In some embodiments, the slicer 500 receives a clock signal, and compares the modified input signal against the threshold value, in response to a pulse (e.g., rising edge, falling edge, high state or low state) of the clock signal. In some embodiments, the slicer 500 resets voltages at intermediate ports (e.g., output ports O1, O2 of the first stage circuit 600), in response to a low state of the clock signal. In some embodiments, the slicer 500 charges the intermediate ports (e.g., output ports O1, O2 of the first stage circuit 600), in response to the low state of the clock signal. In some embodiments, the slicer 500 detects a difference between the differential input signals or PAM4 input signals against the threshold value, in response to a high state of the clock signal.

In some embodiments, the slicer 500 injects 1030 a delayed clock signal to modify the input signal. In some embodiments, the slicer 500 delays the clock signal by an amount corresponding to a time delay for the clock signal to reach transistors (e.g., transistors Ta1, Ta2, Ta3, Ta4 of FIG. 6). Accordingly, distortions due to the clock signal propagating through parasitic capacitances of the transistors are reduced, in some embodiments.

In some embodiments, the slicer 500 generates 1040 a comparison signal at the intermediate ports (e.g., output ports O1, O2 of the first stage circuit 600) of the input signal according to the comparison. In some embodiments, the slicer 500 discharges the intermediate ports according to the voltage difference between the differential input signals or PAM4 input signals against the threshold value, in response to the high state of the clock signal. In some embodiments, for the differential PAM4 input signals, an output port associated with an input signal having a higher voltage than the other input signal discharges faster than the other port associated with the other input signal. Hence, the comparison signal indicates a level of the differential PAM4 input signals by a voltage difference during the discharging.

The slicer 500 senses 1050 the comparison signal according to a first state of the clock signal 550. In some embodiments, the slicer 500 detects a voltage difference at the intermediate ports, for example, due to different discharging rates, and amplifies 1060 the sensed signal or the sensed voltage difference.

Figure 11:
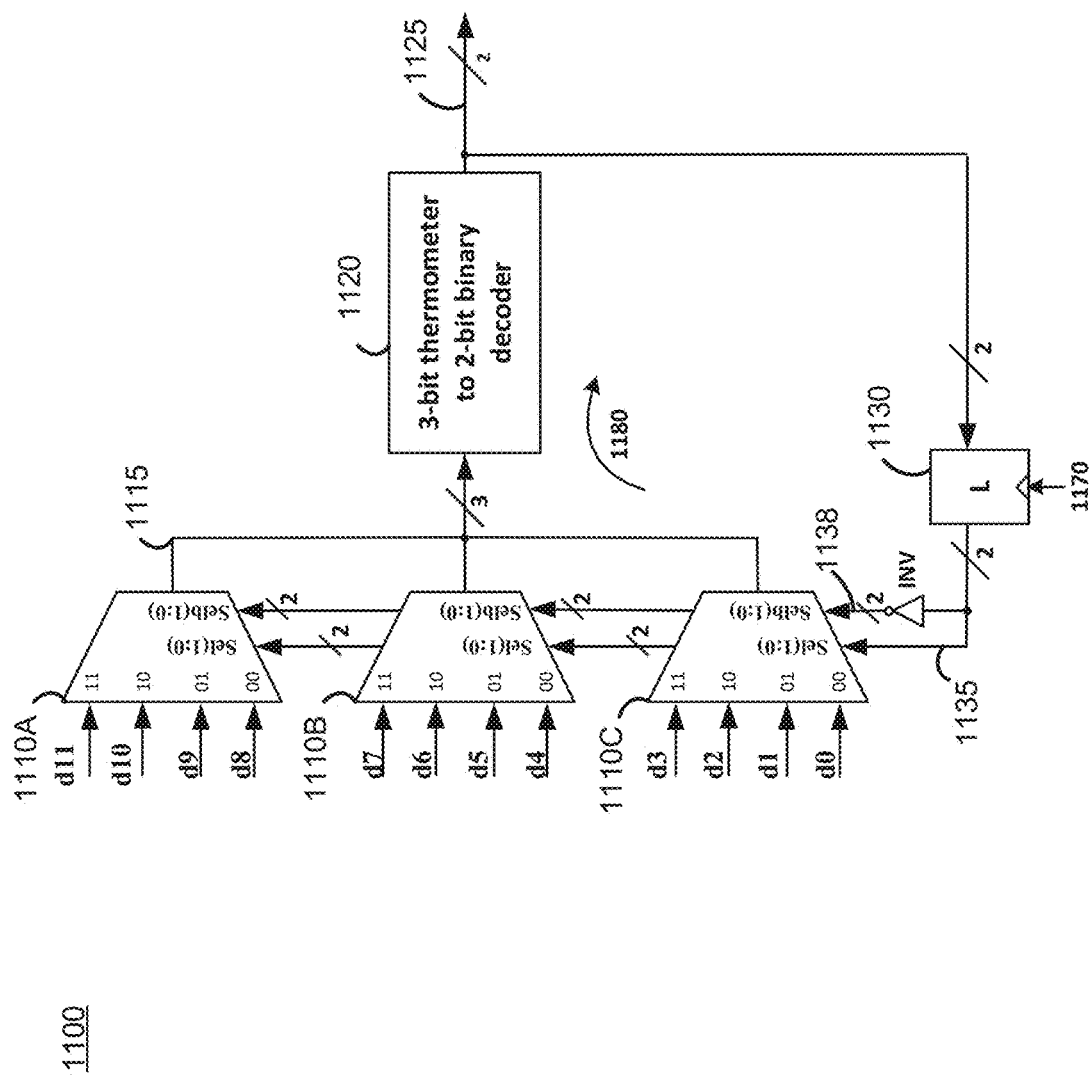
FIG. 11 is a diagram depicting an example speculative tap including a decoder.

Referring to FIG. 11, illustrated is a schematic diagram depicting an example speculative tap 1100 including a decoder 1120. In one implementation, the speculative tap 1100 is implemented to replace the speculative tap 220 and the decoder 230. In one implementation, the speculative tap 1100 includes 4-1 multiplexers 1110A, 1110B, 1110C, 3 bit thermometer to 2 bit binary decoder 1120, two bit latch 1130, and two bit inverter INV. In one implementation, these components operate together to receive bits d0, d1, d2 . . . d11 of a slicer output signal and generate a decoded signal 1125. In one implementation, the bits d0, d1, d2 . . . d11 correspond to output bits 430LA, 430KA . . . 430BA, 430AA of FIG. 4, respectively, or correspond to output bits 430LB, 430KB . . . 430BB, 430AB of FIG. 4, respectively.

In one implementation, each multiplexer 1110 includes i) four input ports (11, 10, 01, 00) coupled to output ports of corresponding slicers, ii) two bit control ports Sel(1:0), iii) two bit inverted control ports Selb(1:0), and iv) an output port. In one implementation, two bit control ports Sel(1:0) of the multiplexers 1110A, 1110B, 1110C are coupled to output ports of the two bit latch 1130, and two bit inverted control ports Selb(1:0) of the multiplexers 1110A, 1110B, 1110C are coupled to output ports of the two bit inverter INV, where the input ports of the two bit inverter INV are coupled to output ports of the two bit latch 1130. Output ports of the multiplexers 1110A, 1110B, 1110C are coupled to input ports of the decoder 1120, and output ports of the decoder 1120 are coupled to input ports of the two bit latch 1130. The two bit latch 1130 includes clock input ports to receive the clock signal 1170.

In one implementation, each of the multiplexers 1110A, 1110B, 1110C receives corresponding four bits of slicer output signals at input ports, and selects one bit of the received bits of the slicer output signals according to two bit control signal 1135 at the control ports and two bit inverted control signal 1138 at the inverted control ports. In one implementation, the multiplexers 1110A, 1110B, 1110C select bits corresponding to a prior symbol. Assuming that the prior symbol corresponds to '3' of PAM4 signal in FIG. 3, the multiplexers 1110A, 1110B, 1110C output bits d11, d7, d3 of the slicer output signal that indicate voltage level of the input signal with respect to three references voltages associated with $2+3\alpha$, $3\alpha$, and $-2+3\alpha$. In one implementation, the decoder 1120 receives a subset of the slicer output signals 1115 selected by the multiplexers 1110 at the input ports, decodes the three bits in thermometer code into two bit binary code, and outputs the two bit decoded signal 1125 at the output ports. In one implementation, the two bit latch 1130 receives the two bit decoded signal 1125 at the input ports, stores the received bits, and outputs the previously stored bits as the control signal 1135 at the output ports in response to a pulse of the clock signal 1170 at the clock port. In one implementation, the two bit inverter INV receives the two bit control signal 1135, and inverts the phase of the control signal 1135 to generate the inverted control signal 1138.

In one implementation, the speculative tap 1100 suffers from a delay in the feedback path 1180. For example, the feedback path 1180 includes the multiplexers 1110, the decoder 1120, the latch 1130 and the inverter INV. In one implementation, the delay in the feedback path 1180 reduces the receiver operating speed.

Figure 12:
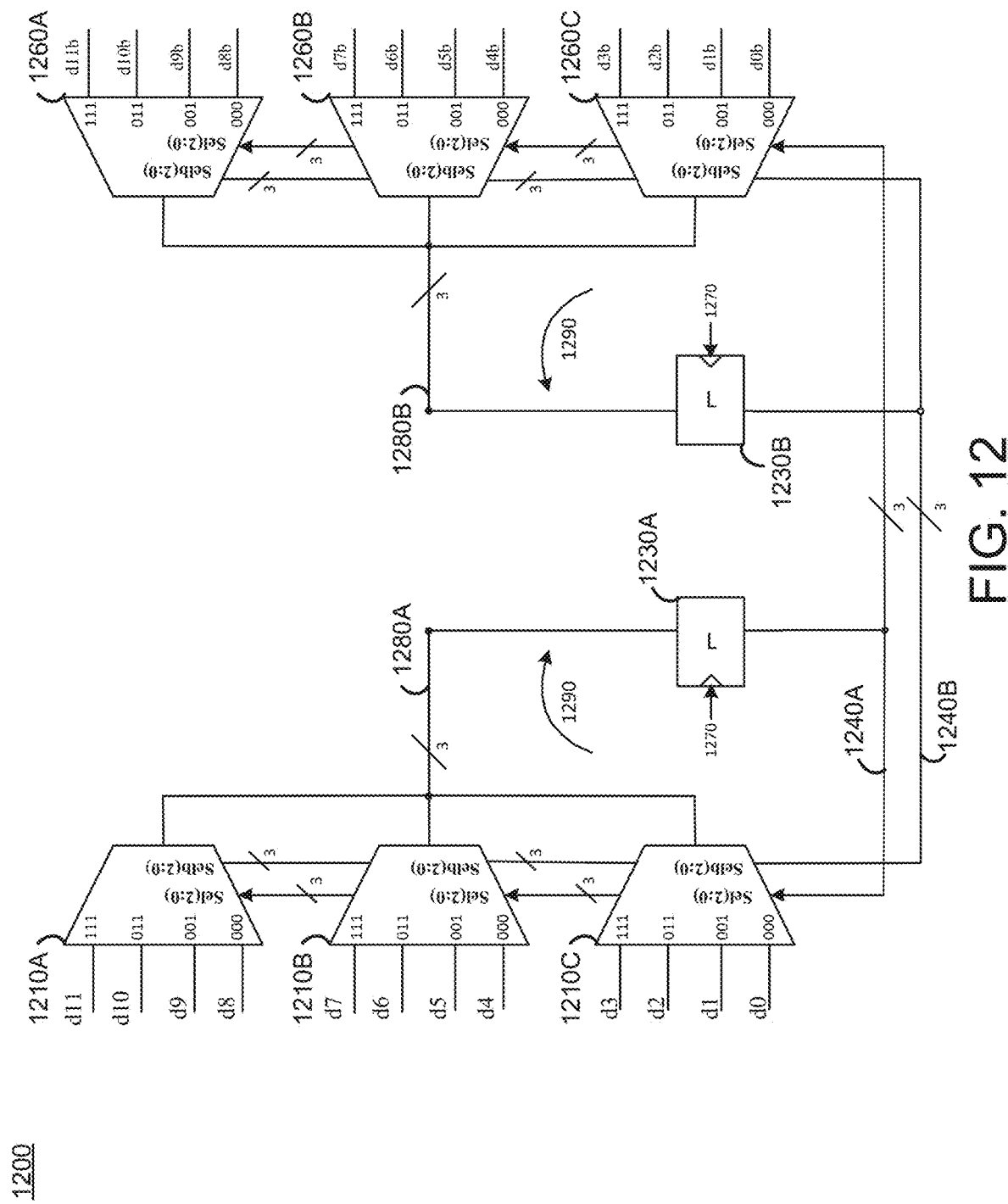
FIG. 12 is a diagram depicting an example speculative tap.

Referring to FIG. 12, illustrated is a schematic diagram depicting an example of an improved speculative tap 1200. In some embodiments, the speculative tap 1200 includes multiplexers 1210A, 1210B, 1210C, 1260A, 1260B, 1260C, and three bit latches 1230A, 1230B. In some embodiments, the speculative tap 1200 is implemented as the speculative tap 220A or 220B of FIG. 2. In some embodiments, the speculative tap 1200 is implemented to process differential PAM4 signals, where output ports of the multiplexers 1210 are directly coupled to input ports of the corresponding latches 1230 without any decoder and any inverter in between, and the output ports of the latches 1230 are directly coupled to control ports of the corresponding multiplexers 1210. In some embodiments, the bits d0, d1, d2 . . . d11 correspond to output bits 430LA, 430KA . . . 430BA, 430AA of FIG. 4, respectively, and the bits d0b, d1b . . . d11b correspond to output bits 430LB, 430KB . . . 430BB, 430AB of FIG. 4, respectively.

In some embodiments, each multiplexer 1210 includes i) four input ports (e.g., 111, 011, 001, 000) coupled to output ports of corresponding slicers, ii) three bit control ports Sel(2:0), iii) three bit inverted control ports Selb(2:0), and iv) an output port. In some embodiments, the output ports of the multiplexers 1210A, 1210B, 1210C are directly coupled to input ports of the three bit latch 1230A. In some embodiments, three bit control ports Sel(2:0) of the multiplexers 1210A, 1210B, 1210C are directly coupled to output ports of the three bit latch 1230A, and three bit inverted control ports Selb(2:0) of the multiplexers 1210A, 1210B, 1210C are directly coupled to output ports of the three bit latch 1230B. Similarly, in some embodiments, the output ports of the multiplexers 1260A, 1260B, 1260C are directly coupled to input ports of the three bit latch 1230B. In some embodiments, three bit control ports Sel(2:0) of the multiplexers 1260A, 1260B, 1260C are directly coupled to output ports of the three bit latch 1230A, and three bit inverted control ports Selb(2:0) of the multiplexers 1260A, 1260B, 1260C are directly coupled to output ports of the three bit latch 1230B.

In some embodiments, each of the multiplexers 1210A, 1210B, 1210C receives corresponding four bits of slicer output signal (e.g., bits 430LA, 430KA . . . 430BA, 430AA) at input ports, and selects one bit of the received bits of the slicer output signals according to three bit control signal 1240A at the control ports and three bit inverted control signal 1240B at the inverted control ports. Similarly, in some embodiments, each of the multiplexers 1260A, 1260B, 1260C receives corresponding four bits of slicer output signals (e.g., bits 430LB, 430KB . . . 430BB, 430AB) at input ports, and selects one bit of the received bits of the slicer output signals according to three bit control signal 1240A at the control ports and three bit inverted control signal 1240B at the inverted control ports. In one aspect, input signals received at the set of multiplexers 1210A, 1210B, 1210C and input signals received at the set of multiplexers 1260A, 1260B, 1260C are differential signals. For example, a bit d11 received at the multiplexer 1210A has an inverted phase of the bit d11b received at the multiplexer 1260A.

In some embodiments, the three bit latch 1230A receives the multiplexer output signal 1280A including selected bits of the slicer output signal at the input ports, stores the received bits, and outputs the previously stored bits as the three bit control signal 1240A at the output ports in response to a pulse of the clock signal 1270 at the clock port. Similarly, in some embodiments, the three bit latch 1230B receives the multiplexer output signal 1280B including selected bits of the slicer output signal at the input ports, stores the received bits, and outputs the previously stored bits as the three bit inverted control signal 1240B at the output ports in response to a pulse of the clock signal 1270 at the clock port. In some embodiments, the control signal 1240A, the inverted control signal 1240B or a combination of the signals 1240A, 1240B are provided to the decoder 230 as the speculative tap output signal 225.

Advantageously, the speculative tap 1200 improves operating speed by omitting the inverter and a decoder in the feedback path 1290. For example, the operating speed of the speculative tap 1200 is improved by 40% compared to the speculative tap 1100 of FIG. 11.

Figure 13:
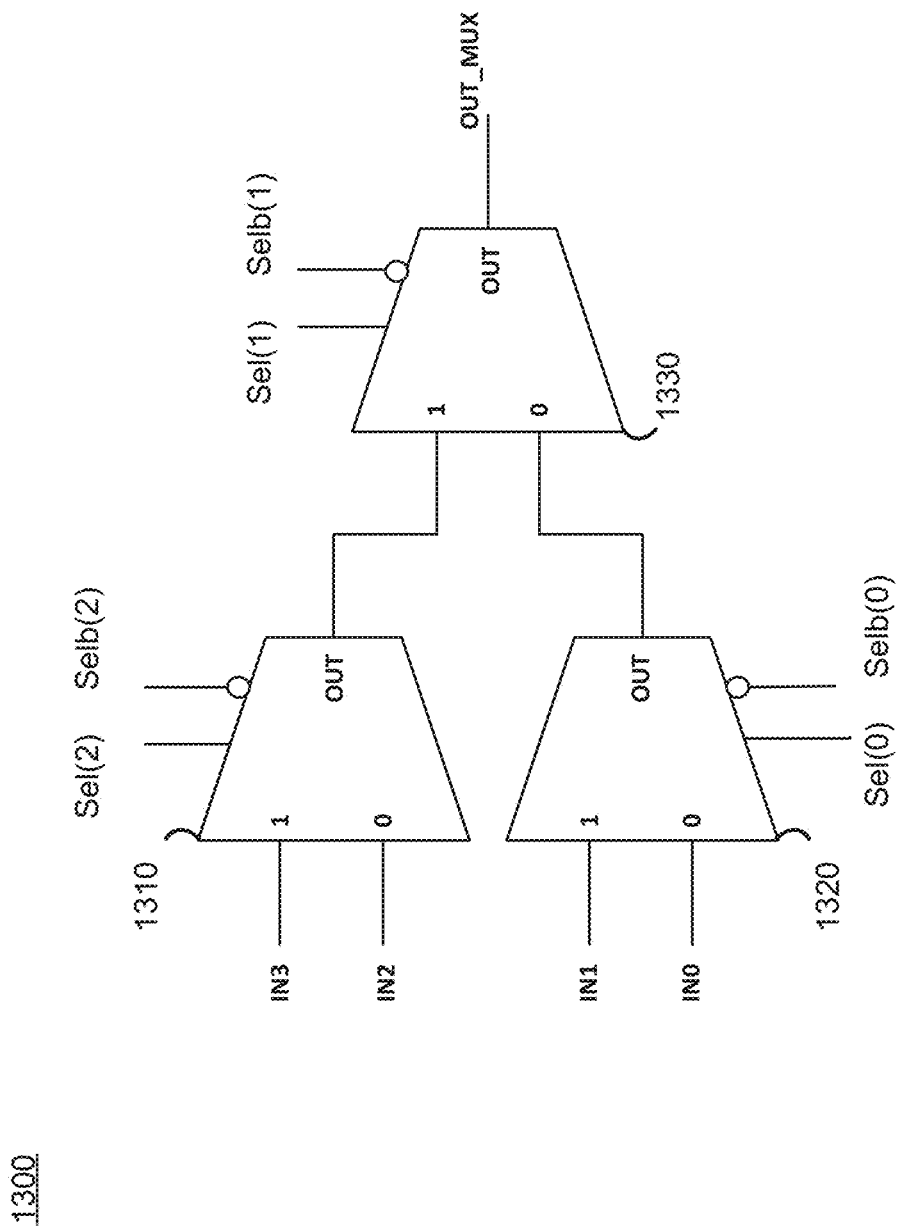
FIG. 13 is a diagram depicting an example multiplexer.

Referring to FIG. 13, illustrated is a schematic diagram depicting an example multiplexer 1300. In some embodiments, the multiplexer 1300 is implemented as one of the multiplexers 1210A, 1201B, 1210C, 1260A, 1260B, 1260C of FIG. 12. In some embodiments, the multiplexer 1300 includes 2-1 multiplexers 1310, 1320, 1330. These component operate together to perform 4-1 multiplexing. In some embodiments, the multiplexer 1300 includes more, fewer, or different components than shown in FIG. 13.

In some embodiments, the multiplexer 1310 includes i) a first input port coupled to input port In3 of the multiplexer 1300, ii) a second input port coupled to input port In2 of the multiplexer 1300, iii) a control port coupled to Sel(2) port, iv) an inverted control port coupled to Selb(2) port, and v) an output port. In some embodiments, the multiplexer 1320 includes i) a first input port coupled to input port In1 of the multiplexer 1300, ii) a second input port coupled to input port In0 of the multiplexer 1300, iii) a control port coupled to Sel(0) port, iv) an inverted control port coupled to Selb(0) port, and v) an output port. In some embodiments, the multiplexer 1330 includes i) a first input port coupled to an output port of the multiplexer 1310, ii) a second input port coupled to an output port of the multiplexer 1320, iii) a control port coupled to Sel(1) port, iv) an inverted control port coupled to Selb(1) port, and v) an output port coupled to an output port OUT_MUX of the multiplexer 1300.

In one configuration, the multiplexer 1300 selects one of signals received at the input ports In0, In1, In2, In3 according to the control signals received at ports Sel<2:0> and Selb<2:0>, and outputs the selected signal at the output port OUT_MUX. In one aspect, the multiplexer 1300 selects a signal as shown in table below.

| Sel<2:0> | 111 | 110 | 101 | 100 | 011 | 010 | 001 | 000 |
|---|---|---|---|---|---|---|---|---|
| OUT | IN3 | IN3 | IN1 | IN0 | IN2 | IN2 | IN1 | IN0 |

By enabling the multiplexer 1300 to operate according to three bit control signals with redundancy rather than two bit control signals, multiplexers 1210A, 1210B, 1210C, 1260A, 1260B, 1260C operate according to direct outputs from the latches 1230A, 1230B without any decoder. Hence, operating speed of the apparatus 200 is improved, in some embodiments.

Figure 14:
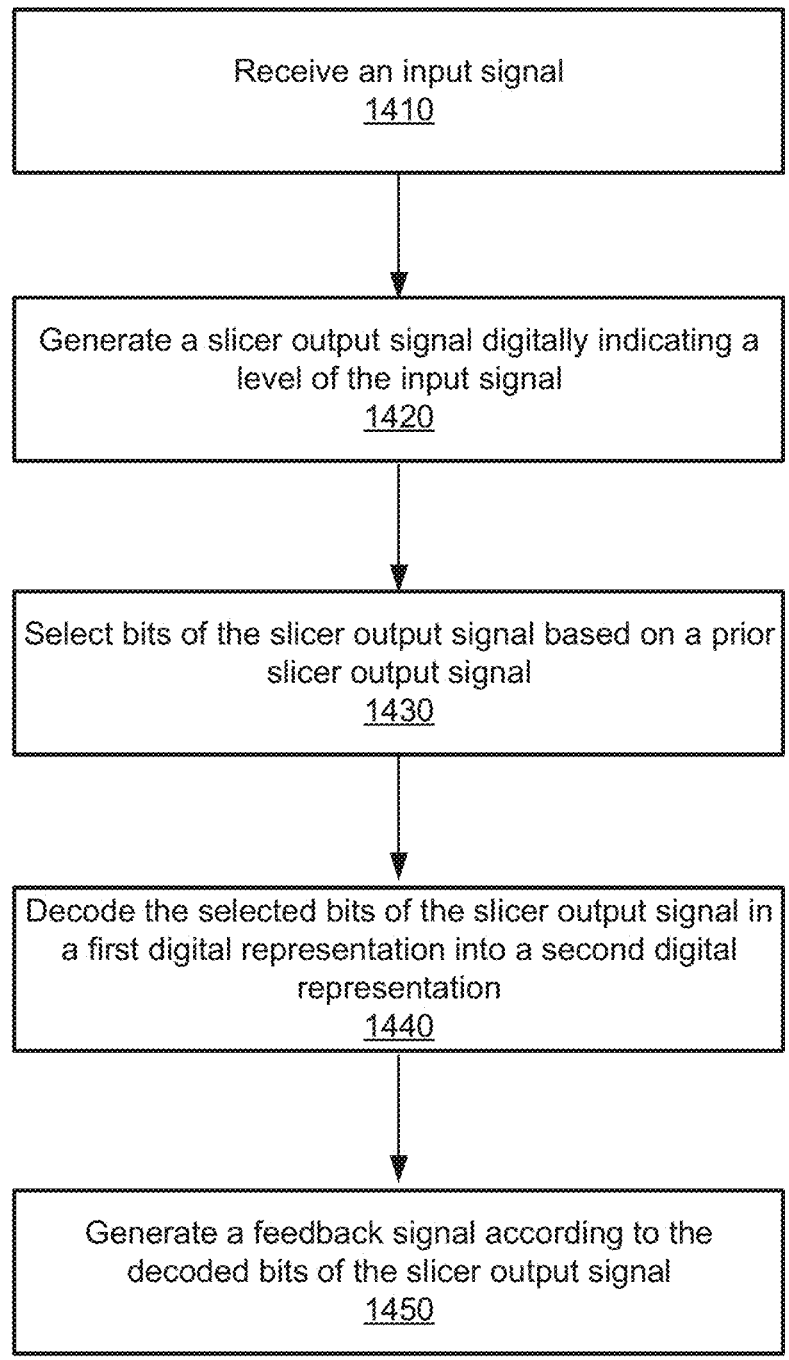
FIG. 14 is a flow chart depicting an example operation of a receiver.

Referring to FIG. 14, illustrated is a flow chart depicting an example process 1400 of receiving signals by a receiver. In some embodiments, the process 1400 is performed by the receiver apparatus 200 of FIG. 2. In some embodiments, the process 1400 is performed by other entities. In some embodiments, the process 1400 includes more, fewer, or different steps than shown in FIG. 14.

In some embodiments, the apparatus 200 receives 1410 an input signal. In some embodiments, the input signal is from another communication device 110. In some embodiments, the input signal conforms to a PAM4 protocol. In some embodiments, a feedback signal is added to the input signal to reduce ISI from an adjacent symbol.

In some embodiments, the apparatus 200 generates 1420 a slicer output signal digitally indicating a level of the input signal. In one example, the slicer output signal indicates the level of the input signal in a thermometer code. For example in FIG. 4, if the voltage level of the input signal corresponds to 1+3α, the first set of bits 430AA, 430BA, 430CA . . . 430LA represents '0000 1111 1111'.

In some embodiments, the apparatus 200 selects 1430 a number of bits of the slicer output signal based on selected bits of a prior slicer output signal. In one aspect, a prior slicer output signal of a slicer output signal precedes the slicer output signal by one or more symbols. By selecting the number of bits of slicers output signal based the selected bits of the prior slicer output signal without a decoder, the operating speed of the apparatus 200 is improved.

In some embodiments, the apparatus 200 decodes 1440 the selected bits of the slicer output signal in a first digital representation into a second digital representation. In some embodiments, the apparatus 200 decodes the selected bits of the slicer output signal in a thermometer code into a binary code.

In some embodiments, the apparatus 200 generates 1450 a feedback signal according to the decoded bits of the slicer output signal. In some embodiments, the feedback signal is added to a subsequent symbol of the input signal to reduce ISI.

Figure 15:
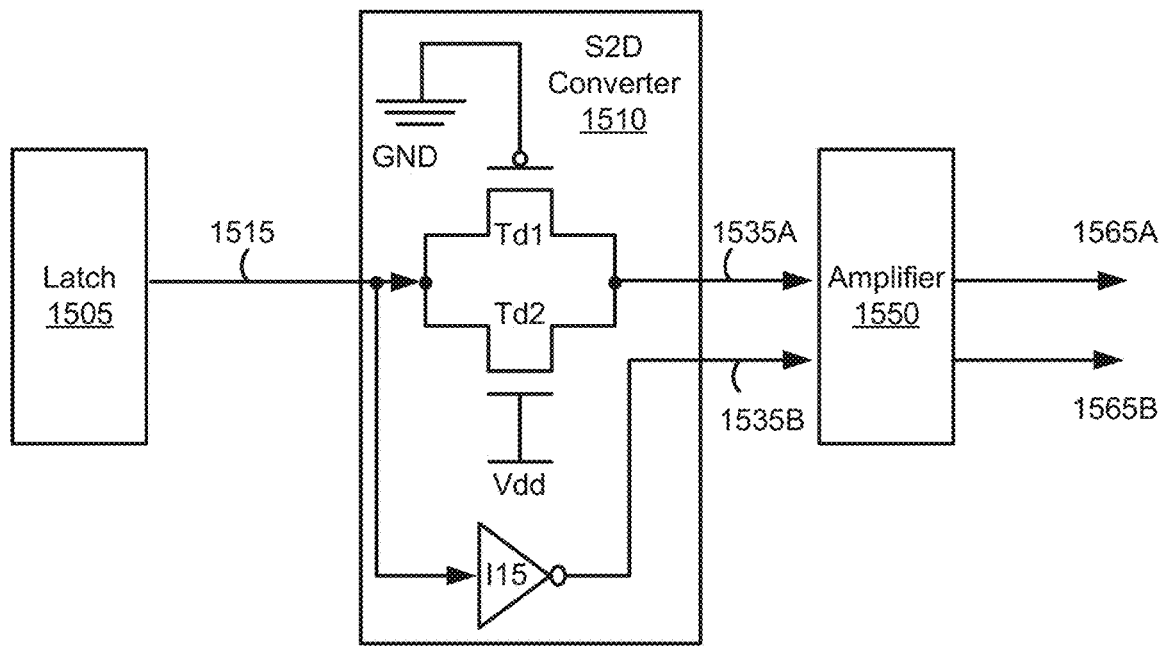
FIG. 15 is a diagram depicting an example feedback tap.

Referring to FIG. 15, illustrated is a schematic diagram depicting an example feedback tap 1500. In one implementation, the feedback tap 1500 includes a latch 1505, a single ended to differential converter 1510, and an amplifier 1550. In one implementation, the single ended to differential converter 1510 receives a latch output signal 1515 from the latch 1505, and converts the latch output signal 1515 into differential signals 1535A, 1535B. In one implementation, the amplifier 1550 amplifies the differential signals 1535A, 1535B to obtain the feedback signals 1565A, 1565B. In one implementation, the feedback tap 1500 is part of the feedback generator 240A or the feedback generator 240B. In one example, the feedback signals 1565A, 1565B are part of the feedback signal 242A, the feedback signal 245A, the feedback signal 242B or the feedback signal 245B.

In one implementation, the latch 1505 includes an input port coupled to an output port of a latch in a preceding tap, and a clock port to receive a clock signal. In one implementation, the latch receives and stores a signal at the input port in response to, for example, a high state of the clock signal, and maintains the stored signal at the output port in response to, for example, a low state of the clock signal. In one implementation, the latch 1505 of a first tap is omitted, because the feedback tap 1500 shares the latch 1230A or 1230B of speculative tap 1200.

In one implementation, the single ended to differential converter 1510 includes i) an input port coupled to the output port of the latch 1505, ii) a first output port, and iii) a second output port. In one implementation, an input port of the single ended to differential converter 1510 of a first tap is coupled to one bit output port of the decoder 230A or the decoder 230B. In one implementation, the single ended to differential converter 1510 includes a P-type transistor Td1 and an N-type transistor Td2 coupled to each other in a transmission gate topology. In one implementation, a gate electrode of the P-type transistor Td1 is coupled to a first supply port, at which a first supply voltage (e.g., 0V) is supplied, a gate electrode of the N-type transistor Td3 is coupled to a second supply port, at which a second supply voltage (e.g., VDD) is supplied. In one implementation, the transistors Td1, Td2 have drain electrodes and source electrodes coupled between the input port of the single ended to differential converter 1510 and the first output port of the single ended to differential converter 1510. Moreover, in one implementation, the single ended to differential converter 1510 includes an inverter I15 having i) an input port coupled to the input port of the single ended to differential converter 1510 and ii) an output port coupled to the second output port of the single ended to differential converter 1510. In one implementation, the transmission gate formed by the transistors Td1, Td2 delays the latch output signal 1515 (or one bit of the decoded signal 235A or 235B) to obtain an in-phase signal 1535A without inverting a phase, and the inverter I15 inverts the phase of the latch output signal 1515 to obtain an inverted-phase signal 1535B.

In one implementation, the amplifier 1550 includes input ports coupled to output ports of the single ended to differential converter 1510. In one implementation, the amplifier 1550 receives the differential signals 1535A, 1535B at the input ports, and amplifies the differential signals 1535A, 1535B to obtain the feedback signals 1565A, 1565B.

Figure 16:
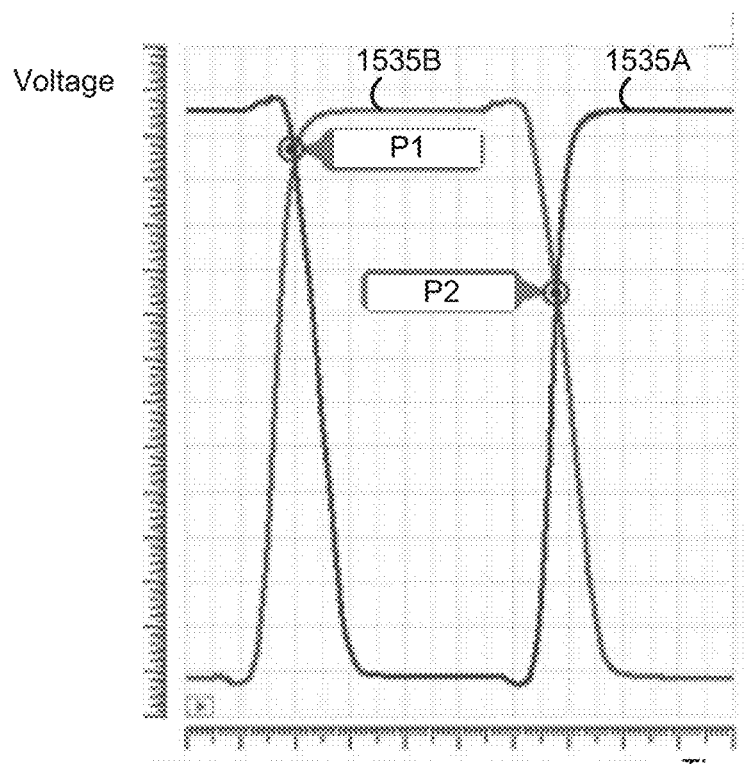
FIG. 16 is a timing diagram depicting an example operation of the feedback tap of FIG. 15.

Referring to FIG. 16, illustrated is a timing diagram depicting an example operation of the feedback tap 1500 of FIG. 15. In one implementation, the crossing points P1, P2 of the signals 1535A, 1535B are not matched. Such imbalanced crossing points P1, P2 distort an eye diagram, and degrade sensitivity. However, the single ended to differential converter 1510 does not allow a single crossing point to be independently controlled. That is, changing the delay of the transmission gate or the inverter I15 changes the crossing points P1, P2 together. Hence, adjusting a crossing point with the single ended to differential converter 1510 is difficult.

Figure 17:
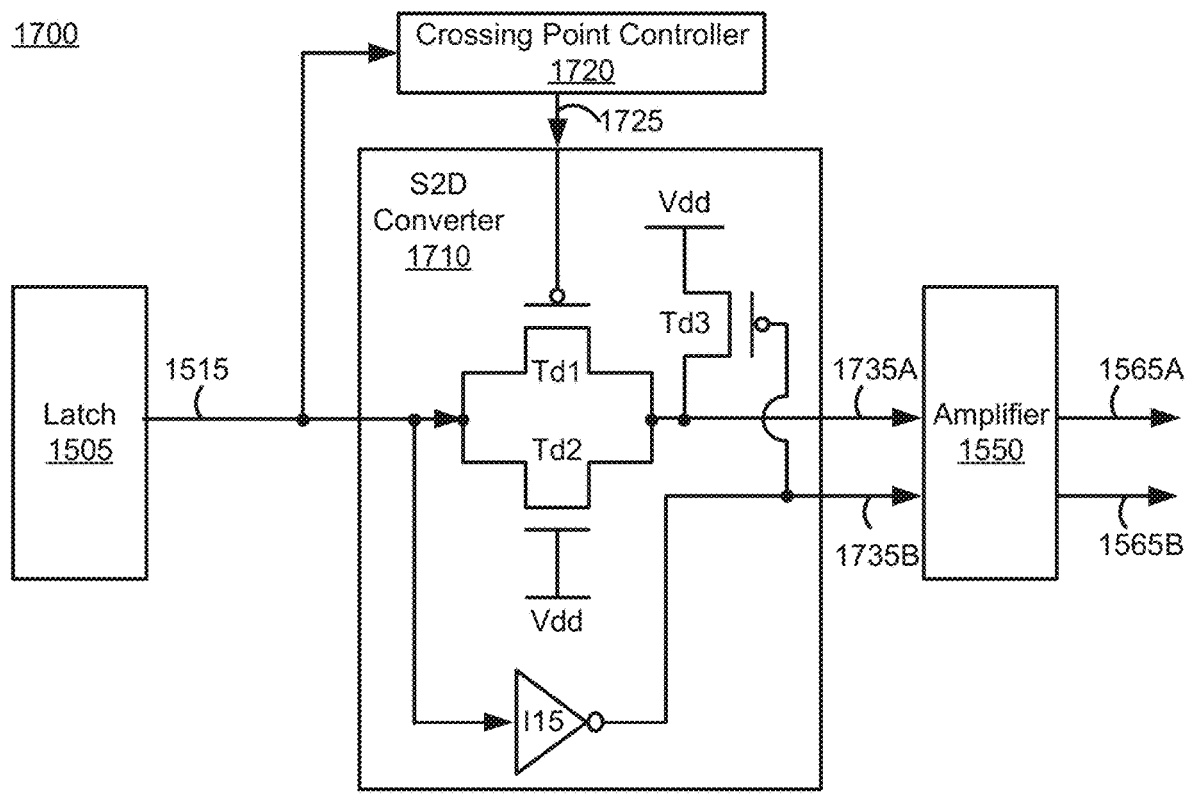
FIG. 17 is a diagram depicting an example feedback tap with a crossing point controller.

Referring to FIG. 17, illustrated is a schematic diagram depicting an example feedback tap 1700 with a crossing point controller 1720. In some embodiments, the feedback tap 1700 is similar to the feedback tap 1500 except that the feedback tap 1700 includes a crossing point controller 1720 and includes a single ended to differential converter 1710 instead of the single ended to differential converter 1510. In some embodiments, the crossing point controller 1720 is coupled between the input port of the single ended to differential converter 1710 and a gate electrode of the transistor Td1 of the single ended to differential converter 1710. In some embodiments, the single ended to differential converter 1710 is similar to the single ended to differential converter 1510 except that a gate electrode of the transistor Td1 is coupled to the output port of the crossing point controller 1720, a transistor Td3 is added, and that the single ended to differential converter 1710 generates the differential signals 1735A, 1735B. Therefore, duplicated description thereof is omitted herein for the sake of brevity.

In one embodiment, the crossing point controller 1720 includes i) an input port coupled to the input port of the single ended to differential converter 1710 and ii) an output port coupled to the gate electrode of the transistor Td1. In this configuration, the crossing point controller 1720 receives the latch output signal 1515 (or one bit of the decoded signal 235A or 235B) at the input port, delays the latch output signal 1515 (or one bit of the decoded signal 235A or 235B) to obtain a delay control signal 1725, and outputs the delay control signal 1725 at the output port. In some embodiments, the delay amount by the crossing point controller 1720 is predetermined or is adjustable.

In one aspect, the transistor Td3 includes a gate electrode coupled to the output port of the inverter I15, a drain electrode coupled to the transistors Td1, Td2, and a source electrode coupled to the second supply port, at which the second supply voltage (e.g., VDD) is supplied. Thus, the transistor Td3 performs pull up, in response to the signal 1735B having a low state (e.g., 0V).

In some embodiments, the crossing point controller 1720 allows a pull down of the signal 1735A to be adjusted without disturbing the pull up of the signal 1735A. In one example, in case the voltage of the latch output signal 1515 (or one bit of the decoded signal 235A or 235B) falls, the transistor Td1 is turned off until the voltage of the latch output signal 1515 (or one bit of the decoded signal 235A or 235B) falls below VDD subtracted by a threshold voltage of the transistor Td1. Hence, in some embodiments, a falling edge of the signal 1735A is delayed without altering a rising edge of the signal 1735A.

Although the crossing point controller 1720 and the single ended to differential converter 1710 are configured to enable adjusting of pull down of the signal 1735A without disturbing the pull up of the signal 1735A, in some embodiments the crossing point controller 1720 and the single ended to differential converter 1710 are configured in a different manner than shown in FIG. 17 to allow adjusting of pull up of the signal 1735A without disturbing the pull down of the signal 1735A. For example, an output port of the crossing point controller 1720 is coupled to a gate electrode of the transistor Td2 instead of the transistor Td1, a gate electrode of the transistor Td1 is coupled to the first supply port, at which the first supply voltage (e.g., 0V or GND) is supplied, and the transistor Td3 is configured to perform pull down instead of pull up, in some embodiments.

Figure 18:
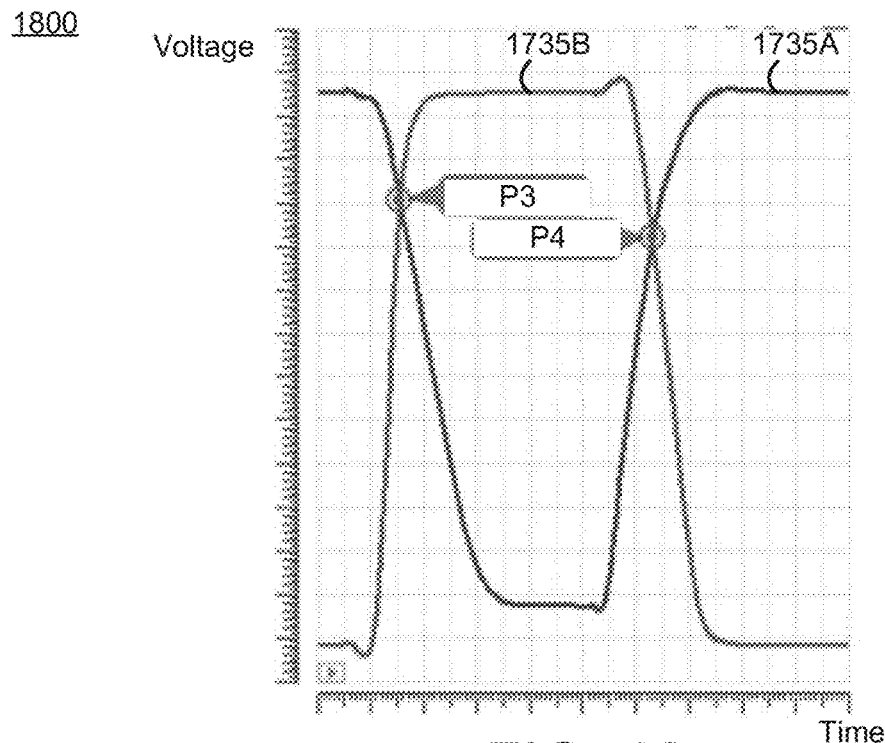
FIG. 18 is a timing diagram depicting an example operation of the feedback tap of FIG. 17.

Referring to FIG. 18, illustrated is a timing diagram depicting an example operation of the feedback tap 1700 of FIG. 17. As shown in FIG. 18, the crossing point controller 1720 enables a pull down to be independently controlled, such that the crossing points P3, P4 of the signals 1735A, 1735B are more balanced compare to the crossing points P1, P2 of the signals 1535A, 1535B of FIG. 16. Hence, a sensitivity of the receiver apparatus 200 is improved, in some embodiments.

Figure 19:
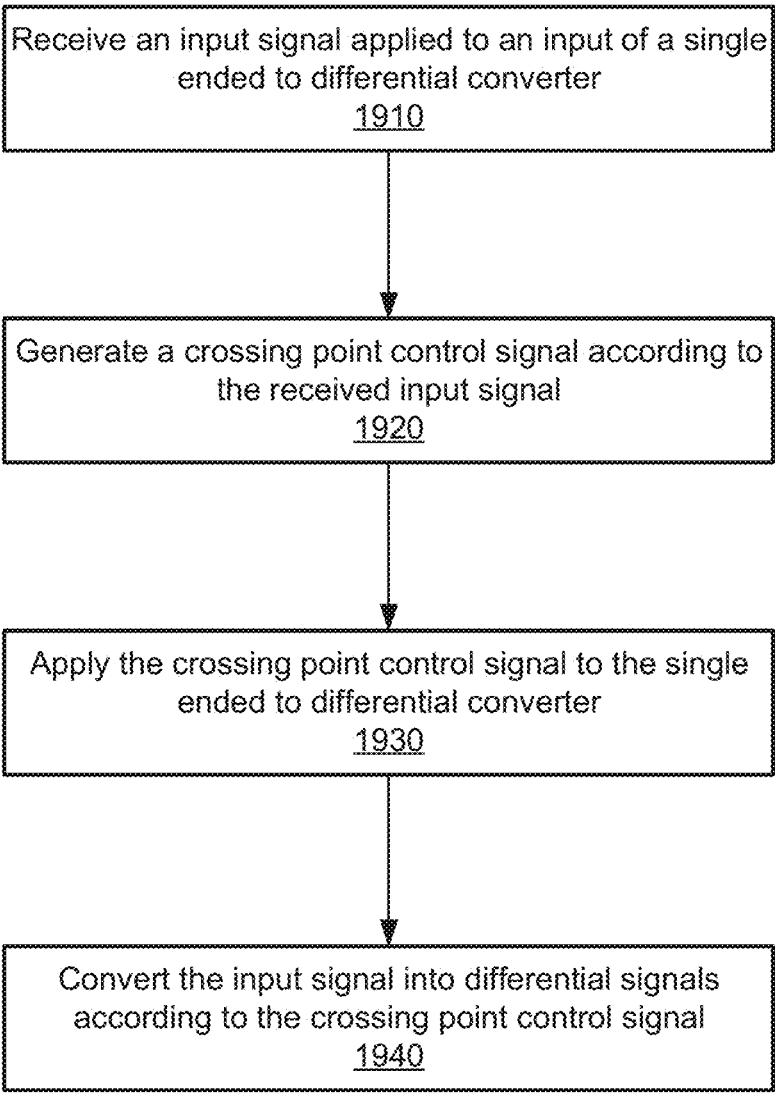
FIG. 19 is a flow chart depicting an example of converting a single ended signal into differential signals.

Referring to FIG. 19, illustrated is a flow chart depicting an example process 1900 of converting a single ended signal into differential signals. In some embodiments, the process 1900 is performed by feedback tap 1700 of FIG. 17. In some embodiments, the process 1900 is performed by other entities (e.g., other single ended to differential converters). In some embodiments, the process 1900 includes more, fewer or different steps than shown in FIG. 19.

In some embodiments, the feedback tap 1700 receives 1910 an input signal applied to an input of a single ended to differential converter. In some embodiments, the input signal is an output of the latch 1505, a one bit output of the decoder 230, or any circuitry.

In some embodiments, the feedback tap 1700 generates 1920 a crossing point control signal according to the received input signal. In one approach, the feedback tap 1700 delays the input signal to obtain the crossing point control signal. In some embodiments, the delay amount is predetermined or is adjustable.

In some embodiments, the feedback tap 1700 applies 1930 the crossing point control signal to a single ended to differential converter and converts 1940 the input signal into the differential signals according to the crossing point control signal. In one approach, the single ended to differential converter includes a transmission gate with i) a P-type transistor having a gate electrode to receive the crossing point control signal and ii) an N-type transistor having a gate electrode supplied with a supply voltage (e.g., VDD). In some embodiments, by applying the crossing point control signal only to the P-type transistor but not to the N-type transistor, a falling edge of a signal of the differential signals is adjusted without altering a rising edge of the signal.

Although various embodiments disclosed herein implemented one or more latches for timing circuits, in some embodiments, one or more flip flops are implemented to replace the functionality of the latches. In some embodiments, a flip flop is implemented by two or more latches.

In some embodiments, a signal includes multiple bits. In some embodiments, two or more of one bit signals constitute the signal including two or more bits. Accordingly, in some embodiments, two or more of one bit components constitute a component including two or more bits. For example, three of one bit latches constitute a three bit latch. For another example, twelve of one bit output ports constitute a twelve bit output port.

Various embodiments disclosed herein are related to an apparatus for high speed communication device. In some embodiments, the apparatus includes a first set of slicers including input ports to receive a first input signal. In some embodiments, the first set of slicers is configured to generate a first slicer output signal comprising outputs of the first set of slicers. In some embodiments, the first slicer output signal digitally indicates a level of the first input signal. In some embodiments, the apparatus includes a first speculative tap including input ports coupled to output ports of the first set of slicers. In some embodiments, the first speculative tap is configured to select outputs of a subset of the first set of slicers based on a second slicer output signal. In some embodiments, the apparatus includes a first decoder including input ports coupled to output ports of the first speculative tap. In some embodiments, the first decoder is configured to decode the selected outputs of the subset of the first set of slicers in a first digital representation into a second digital representation. In some embodiments, the apparatus includes a first feedback generator including input ports coupled to output ports of the first decoder and output ports coupled to the input ports of the first set of slicers. In some embodiments, the first feedback generator is configured to generate a first feedback signal according to the decoded outputs of the subset of the first set of slicers in the second representation and to output the first feedback signal at its output ports. In some embodiments, the first feedback signal modifies the first input signal.

In some embodiments, the first speculative tap includes a first set of multiplexers comprising input ports coupled to output ports of the first set of slicers, and a first set of latches comprising input ports coupled to output ports of the first set of multiplexers.

In some embodiments, the first speculative tap does not include a decoder between the first set of multiplexers and the first set of latches.

In some embodiments, the apparatus further includes a second set of slicers comprising input ports to receive a second input signal. In some embodiments, the second set of slicers is configured to generate the second slicer output signal comprising outputs of the second set of slicers. In some embodiments, the second slicer output signal digitally indicates a level of the second input signal. In some embodiments, the apparatus further includes a second speculative tap comprising input ports coupled to output ports of the second set of slicers. In some embodiments, the second speculative tap is configured to select outputs of a subset of the second set of slicers based on the first slicer output signal. In some embodiments, the apparatus further includes a second decoder comprising input ports coupled to output ports of the second speculative tap. In some embodiments, the second decoder is configured to decode the selected outputs of the subset of the second set of slicers in the first digital representation into the second digital representation.

In some embodiments, the apparatus further includes a second feedback generator including input ports coupled to output ports of the second decoder, and output ports coupled to the input ports of the second set of slicers. In some embodiments, the second feedback generator is configured to generate a second feedback signal according to the decoded outputs of the subset of the second set of slicers in the second representation and to output the second feedback signal at its output ports. In some embodiments, the second feedback signal modifies the second input signal.

In some embodiments, the first speculative tap is configured to select the outputs of the subset of the first set of slicers according to the selected outputs of the subset of the second set of slicers. In some embodiments, the second speculative tap is configured to select the outputs of the subset of the second set of slicers according to the selected outputs of the subset of the first set of slicers.

In some embodiments, the second speculative tap includes a second set of multiplexers comprising input ports coupled to output ports of the second set of slicers, and a second set of latches comprising input ports coupled to output ports of the second set of multiplexers.

In some embodiments, the output ports of the first set of multiplexers are directly coupled to the input ports of the first set of latches. In some embodiments, the output ports of the second set of multiplexers are directly coupled to the input ports of the second set of latches. In some embodiments, output ports of the first set of latches are directly coupled to control ports of the second set of multiplexers. In some embodiments, output ports of the second set of latches are directly coupled to control ports of the first set of multiplexers.

In some embodiments, each multiplexer of the first set of multiplexers is controlled according to outputs of the second set of latches, and each multiplexer of the second set of multiplexers is controlled according to outputs of the first set of latches.

In some embodiments, the first set of latches is clocked according to a clock signal, and the second set of latches is clocked according to an inverse of the clock signal.

In some embodiments, the apparatus includes a first feedback tap including input ports coupled to the output ports of the first decoder, and output ports coupled to the input ports of the second set of slicers. In some embodiments, the first feedback tap is configured to generate a third feedback signal according to the decoded outputs of the subset of the first set of slicers and to output the third feedback signal at its output ports. In some embodiments, the third feedback signal modifies the second input signal. In some embodiments, the apparatus includes a second feedback tap including input ports coupled to the output ports of the second decoder, and output ports coupled to the input ports of the first set of slicers. In some embodiments, the second feedback tap is configured to generate a fourth feedback signal according to the decoded outputs of the subset of the second set of slicers and to output the fourth feedback signal at its output ports. In some embodiments, the fourth feedback signal modifies the first input signal.

In some embodiments, the first feedback generator includes a single-ended to differential converter including i) an input port coupled to a corresponding output port from the output ports of the first decoder, and ii) differential output ports. In some embodiments, the single-ended to differential converter is configured to convert a single ended signal at the input port of the single-ended to differential converter into differential signals and output the differential signals through the differential output ports. In some embodiments, the differential signals modify the first input signal.

In some embodiments, the first feedback generator further includes a crossing point controller coupled to the input port of the single-ended to differential converter and a control port of the single-ended to differential converter. In some embodiments, the crossing point controller is configured to delay one of a pull up or a pull down of a first signal of the differential signals without delaying the other one of the pull up or the pull down of the first signal.

In some embodiments, the crossing point controller comprises delay circuits.

In some embodiments, the apparatus includes a pull up transistor coupled between one of the differential output ports and the other of the differential output ports.

In some embodiments, the single-ended to differential converter includes a P-type transistor and an N-type transistor coupled in parallel with each other between the input port of the single-ended to differential converter and one of the differential output ports. In some embodiments, a gate electrode of the P-type transistor is coupled to an output port of the crossing point controller. In some embodiments, a gate electrode of the N-type transistor is coupled to a supply port, at which a supply voltage is supplied.

In some embodiments, the input signal conforms to a pulse amplitude modulated (PAM) 4 protocol.

In some embodiments, the first speculative tap includes a multiplexer to select one of the selected outputs of the subset of the first set of slicers according to a redundant number of bits of the second slicer output signal.

Various embodiments disclosed herein are related to an apparatus for high speed communication. In some embodiments, the apparatus includes a latch, and a single-ended to differential converter coupled to the latch. In some embodiments, the single-ended to differential converter is configured to convert a single ended signal from the latch into differential signals. In some embodiments, the apparatus includes a crossing point controller coupled between the latch and the single-ended to differential converter. In some embodiments, the crossing point controller is configured to delay one of a pull up or a pull down of a first signal of the differential signals without delaying the other one of the pull up or the pull down of the first signal.

In some embodiments, the single-ended to differential converter includes a first transistor having a gate electrode controlled by the crossing point controller, and a second transistor having a gate electrode coupled to a supply port, at which a supply voltage is supplied. In some embodiments, the first transistor and the second transistor are coupled to each other in parallel.

In some embodiments, the apparatus is a feedback tap.

Various embodiments disclosed herein are related to a high speed communication. In some embodiments, the apparatus includes a set of slicers configured to generate a slicer output signal digitally indicating a level of an input signal received by the set of slicers. In some embodiments, the apparatus includes a speculative tap coupled to the set of slicers. In some embodiments, the speculative tap is configured to select bits of the slicer output signal based on a prior slicer output signal. In some embodiments, the speculative tap includes a multiplexer to select a bit of the selected bits according to a redundant number of bits of the selected bits of the prior slicer output signal. In some embodiments, the apparatus includes a decoder coupled to the speculative tap. In some embodiments, the decoder is configured to decode the selected bits of the slicer output signal in a first digital representation into a second digital representation. In some embodiments, the apparatus includes a feedback generator coupled to the decoder. In some embodiments, the feedback generator is configured to generate a feedback signal according to the decoded bits of the slicer output signal. In some embodiments, the feedback signal modifies the input signal.

Various embodiments disclosed herein are related to an apparatus for high speed communication. In some embodiments, the apparatus includes a comparator including a first input port to receive a first input signal, a reference port to receive a reference signal, and a clock port to receive a clock signal. In some embodiments, the comparator is configured to compare the first input signal and the reference signal according to a pulse of the clock signal. In some embodiments, the apparatus includes a kickback cancellation circuit coupled to the first input port of the comparator. In some embodiments, the kickback cancellation circuit is configured to inject a delayed clock signal to the first input port of the comparator. In some embodiments, the delayed clock signal is delayed from the clock signal.

In some embodiments, the comparator is configured to reset a voltage at an output port of the comparator, in response to a first state of the clock signal, and modify the voltage at the output port of the comparator according to the comparison of the first input signal and the reference signal, in response to a second state of the clock signal.

In some embodiments, the comparator is configured to charge an output port of the comparator, in response to a first state of the clock signal, and discharge the output port of the comparator according to the comparison of the first input signal and the reference signal, in response to a second state of the clock signal.

In some embodiments, the comparator further includes a first capacitor coupled between the first input port of the comparator and the kickback cancellation circuit. In some embodiments, the kickback cancellation circuit is configured to inject the delayed clock signal to the first input port through the first capacitor.

In some embodiments, the first capacitor is a metal oxide semiconductor (MOS) capacitor or a metal oxide metal (MOM) capacitor.

In some embodiments, the comparator further includes a second input port to receive a second input signal. In some embodiments, the comparator is configured to charge an output port of the comparator and another output port of the comparator, in response to a first state of the clock signal, and discharge the output port of the comparator and the another output port of the comparator at different rates according to i) a first difference between the first input signal and the reference signal and ii) a second difference between the second input signal and the reference signal, in response to a second state of the clock signal.

In some embodiments, the kickback cancellation circuit is configured to inject the delayed clock signal to the second input port of the comparator.

In some embodiments, the kickback cancellation circuit is configured to inject the delayed clock signal to the reference port of the comparator.

In some embodiments, input impedances of the first input port, the second input port, and the reference port are matched.

In some embodiments, the comparator further includes a first transistor including i) a source electrode, ii) a gate electrode coupled to the first input port, and iii) a drain electrode. In some embodiments, the comparator further includes a second transistor including i) a source electrode coupled to the source electrode of the first transistor, ii) a gate electrode coupled to the reference port, and iii) a drain electrode. In some embodiments, the comparator further includes a third transistor including i) a source electrode, ii) a gate electrode coupled to the second input port, and iii) a drain electrode coupled to the drain electrode of the second transistor. In some embodiments, the comparator further includes a fourth transistor including i) a source electrode coupled to the source electrode of the third transistor, ii) a gate electrode coupled to the reference port, and iii) a drain electrode coupled to the drain electrode of the first transistor.

In some embodiments, the comparator further includes a fifth transistor including i) a gate electrode coupled to the clock port, and ii) a drain electrode coupled to the source electrode of the first transistor and the source electrode of the second transistor. In some embodiments, the comparator further includes a sixth transistor including i) a gate electrode coupled to the clock port, and ii) a drain electrode coupled to the source electrode of the third transistor and the source electrode of the fourth transistor.

In some embodiments, the comparator further includes a seventh transistor including i) a gate electrode coupled to the clock port, and ii) a drain electrode coupled to the drain electrode of the second transistor and the drain electrode of the third transistor. In some embodiments, the comparator further includes an eighth transistor including i) a gate electrode coupled to the clock port, and ii) a drain electrode coupled to the drain electrode of the first transistor and the drain electrode of the fourth transistor.

In some embodiments, the apparatus further includes an SR latch configured to increase a voltage difference at a first output port and a second output port of the comparator. In some embodiments, the SR latch includes a sensing circuit coupled to the first output port and the second output port of the comparator. In some embodiments, the sensing circuit is configured to sense the voltage difference at the first output port and the second output port of the comparator according to the clock signal. In some embodiments, the SR latch includes a regeneration circuit coupled to a first output port and a second output port of the sensing circuit. In some embodiments, the regeneration circuit amplifies the sensed voltage difference from the sensing circuit.

In some embodiments, the sensing circuit includes cross-coupled transistors coupled to the first output port and the second output port of the sensing circuit, and a switch transistor coupled to the cross-coupled transistors in series. In some embodiments, the switch transistor is configured to enable or disable current flow through the cross-coupled transistors according to the clock signal.

In some embodiments, the sensing circuit further includes a first transistor including i) a gate electrode coupled to the first output port of the comparator, and ii) a drain electrode coupled to the second output port of the sensing circuit and the cross-coupled transistors. In some embodiments, the sensing circuit further includes a second transistor including i) a gate electrode coupled to the second output port of the comparator, and ii) a drain electrode coupled to the first output port of the sensing circuit and the cross-coupled transistors.

In some embodiments, the regeneration circuit further comprises a first transistor and a second transistor coupled to each other at a first output port of the regeneration circuit. In some embodiments, the regeneration circuit further includes a third transistor and a fourth transistor coupled to each other at a second output port of the regeneration circuit. In some embodiments, the first transistor is controlled according to a voltage at the first output port of the sensing circuit. In some embodiments, the fourth transistor is controlled according to an inverse of the voltage at the first output port of the sensing circuit. In some embodiments, the third transistor is controlled according to a voltage at the second output port of the sensing circuit. In some embodiments, the second transistor is controlled according to an inverse of the voltage at the second output port of the sensing circuit. In some embodiments, the regeneration circuit further includes cross-coupled inverters coupled between the first output port and the second output port of the regeneration circuit.

In some embodiments, the apparatus is a slicer circuit.

Various embodiments disclosed herein are related to an apparatus for high speed communication. In some embodiments, the apparatus includes a sensing circuit configured to sense a voltage difference at input ports of the sensing circuit according to a clock signal. In some embodiments, the apparatus includes a regeneration circuit coupled to output ports of the sensing circuit. In some embodiments, the regeneration circuit is configured to amplify the sensed voltage difference. In some embodiments, the regeneration circuit includes a first transistor and a second transistor coupled to each other at a first output port of the regeneration circuit. In some embodiments, the regeneration circuit includes a third transistor and a fourth transistor coupled to each other at a second output port of the regeneration circuit. In some embodiments, the first transistor is controlled according to a voltage at a first output port of the sensing circuit. In some embodiments, the fourth transistor is controlled according to an inverse of the voltage at the first output port of the sensing circuit. In some embodiments, the third transistor is controlled according to a voltage at a second output port of the sensing circuit. In some embodiments, the second transistor is controlled according to an inverse of the voltage at the second output port of the sensing circuit. In some embodiments, the voltage at the first output port of the sensing circuit is different from the inverse of the voltage at the second output port of the sensing circuit.

In some embodiments, the regeneration circuit further includes a first inverter coupled between the first output port of the regeneration circuit and a gate electrode of the fourth transistor, and a second inverter coupled between the second output port of the regeneration circuit and a gate electrode of the second transistor.

In some embodiments, the apparatus is a latch circuit.

Various embodiments disclosed herein are related to an apparatus. In some embodiments, the apparatus includes a first stage circuit configured to discharge output ports of the first stage circuit at different discharge rates according to a voltage difference of input signals in response to a clock signal. In some embodiments, the apparatus includes a second stage circuit coupled to the first stage circuit. In some embodiments, the second stage circuit is configured to sense voltages at the output ports of the first stage circuit according to the different discharge rates, and generate a first pulse signal and a second pulse signal according to the sensed voltages. In some embodiments, the first pulse signal and the second pulse signal indicate which output port of the output ports of the first stage circuit is discharged faster. In some embodiments, the apparatus includes a sensing circuit coupled to the second stage circuit. In some embodiments, the sensing circuit is configured to generate an output signal according to a voltage difference between the first pulse signal and the second pulse signal, in response to a first state of the clock signal, and maintain the output signal, in response to a second state of the clock signal. In some embodiments, the apparatus includes a regeneration circuit coupled to the sensing circuit and configured to amplify the output signal.

Various embodiments disclosed herein are related to an apparatus for high speed communication. In some embodiments, the apparatus includes a comparator configured to compare an input signal at an input port and a reference signal at a reference port according to a pulse of a clock signal at a clock port, and to generate an output signal indicating a level of the input signal according to the comparison. In some embodiments, the apparatus includes a kickback cancellation circuit coupled to the comparator. In some embodiments, the kickback cancellation circuit is configured to inject a delayed clock signal to the input port. In some embodiments, the delayed clock signal is delayed from the clock signal.

Figure 20A:
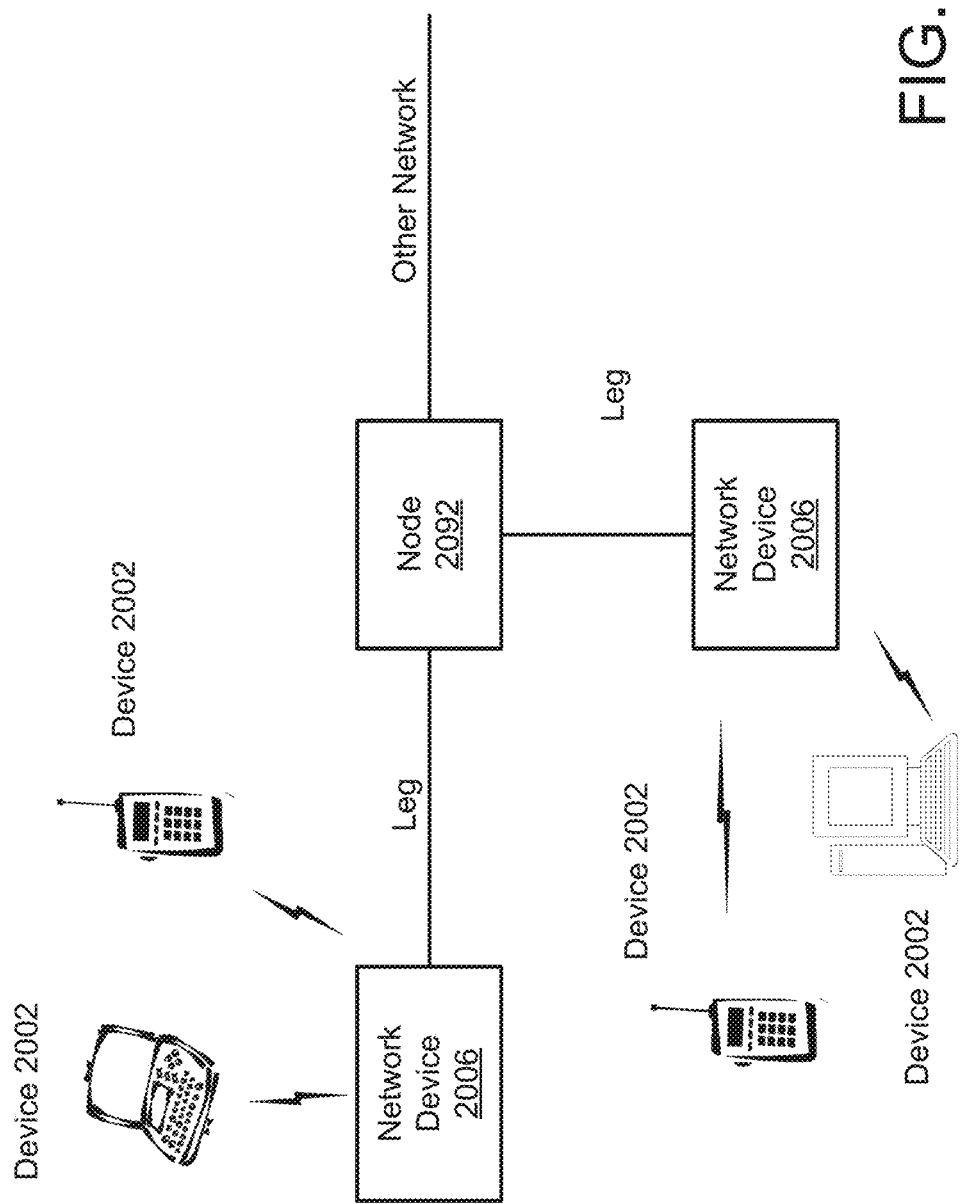
FIG. 20A is a block diagram depicting an embodiment of a network environment including one or more network devices in communication with one or more devices or stations.

B. Computing and Network Environment Having discussed specific embodiments of the present solution, it may be helpful to describe aspects of the operating environment as well as associated system components (e.g., hardware elements) in connection with the methods and systems described herein. Referring to FIG. 20A, an embodiment of a network environment is depicted. In brief overview, the network environment includes a communication system that includes one or more network devices 2006, one or more communication devices 2002 and a node 2092. The communication devices 2002 may for example include laptop computers 2002, tablets 2002, personal computers 2002 and/or cellular telephone devices 2002. In some embodiments, the device 2002, the network device 2006, the node 2092, or any combination is implemented as the communication device 110 of FIG. 1. The details of an embodiment of each communication device and/or network device are described in greater detail with reference to FIGS. 20B and 20C. The network environment can be an ad hoc network environment, an infrastructure network environment, a subnet environment, etc.

The network devices 2006 may be operably coupled to the node 2092 via local area network connections. The node 2092, which may include a router, gateway, switch, bridge, modem, system controller, appliance, etc., may provide a local area network connection for the communication system. Each of the network devices 2006 may have an associated antenna or an antenna array to communicate with the communication devices 2002 in its area. The communication devices 2002 may register with a particular network device 2006 to receive services from the communication system (e.g., via a SU-MIMO or MU-MIMO configuration). For direct connections (e.g., point-to-point communications), some communication devices 2002 may communicate directly via an allocated channel and communications protocol. Some of the communication devices 2002 may be mobile or relatively static with respect to the network device 2006.

In some embodiments a network device 2006 includes a device or module (including a combination of hardware and software) that allows communication devices 2002 to connect to a wired network using Wi-Fi, or other standards. A network device 2006 may be configured, designed, and/or built for operating in a wireless local area network (WLAN). A network device 2006 may connect to a router (e.g., via a wired network) as a standalone device in some embodiments. In other embodiments, a network device can be a component of a router. A network device 2006 can provide multiple devices 2002 access to a network. A network device 2006 may, for example, connect to the devices 2002 through a wired Ethernet connection, a wireless Wi-Fi connection, or both. A network device 2006 may be built and/or configured to support a standard for sending and receiving data using one or more radio frequencies. Those standards, and the frequencies they use may be defined by the IEEE (e.g., IEEE 802.11 standards). A network device may be configured and/or used to support public Internet hotspots, and/or on an internal network to extend the network's Wi-Fi signal range.

In some embodiments, the network devices 2006 may be used for (e.g., in-home or in-building) wireless networks (e.g., IEEE 802.11, Bluetooth, ZigBee, any other type of radio frequency based network protocol and/or variations thereof). Each of the communication devices 2002 may include a built-in radio and/or is coupled to a radio. Such communication devices 2002 and/or network devices 2006 may operate in accordance with the various aspects of the disclosure as presented herein to enhance performance, reduce costs and/or size, and/or enhance broadband applications. Each communication devices 2002 may have the capacity to function as a client node seeking access to resources (e.g., data, and connection to networked nodes such as servers) via one or more network devices 2006.

The network connections may include any type and/or form of network and may include any of the following: a point-to-point network, a broadcast network, a telecommunications network, a data communication network, and a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 20B:
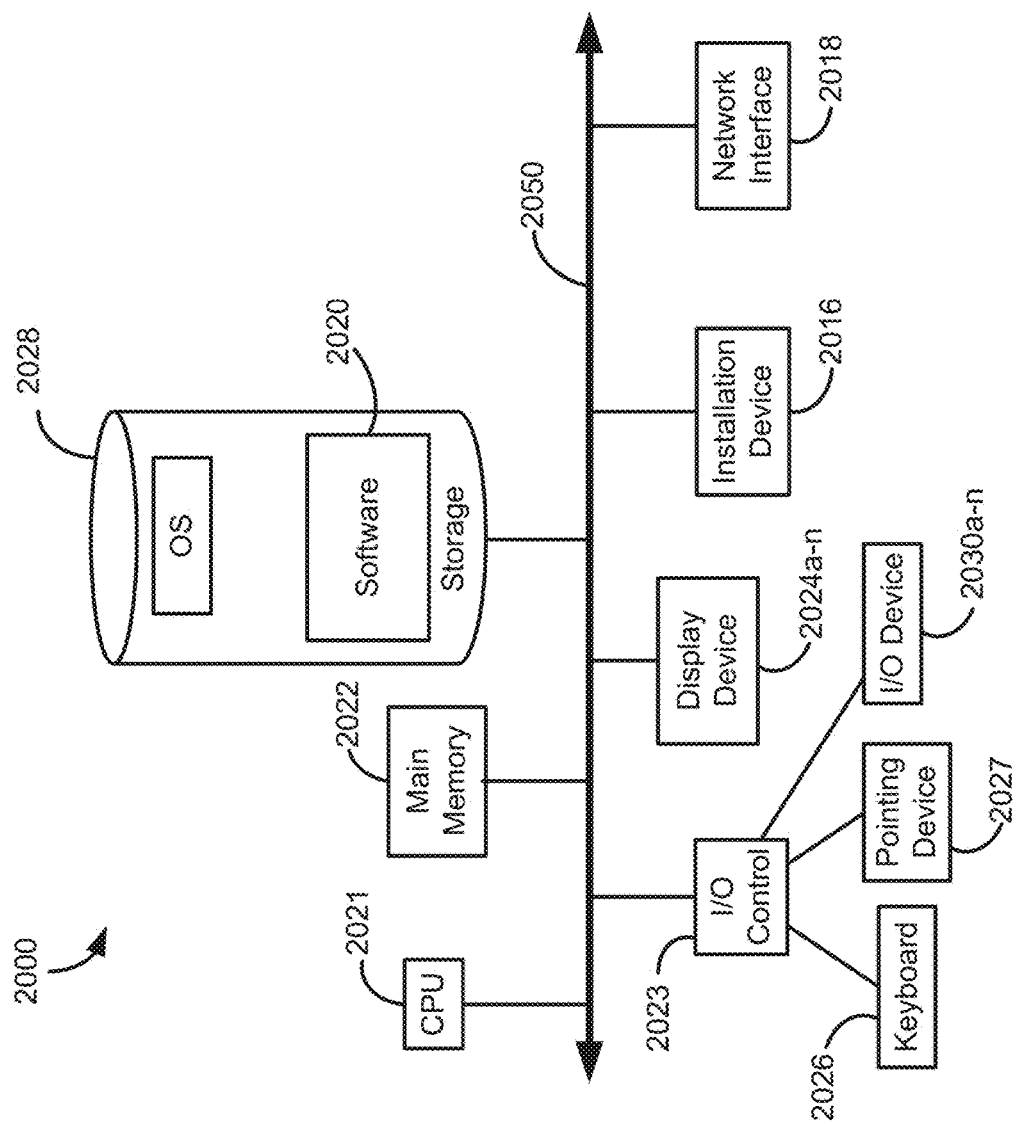
FIGS. 20B and 20C are block diagrams depicting embodiments of computing devices useful in connection with the methods and systems described herein.
Figure 20C:
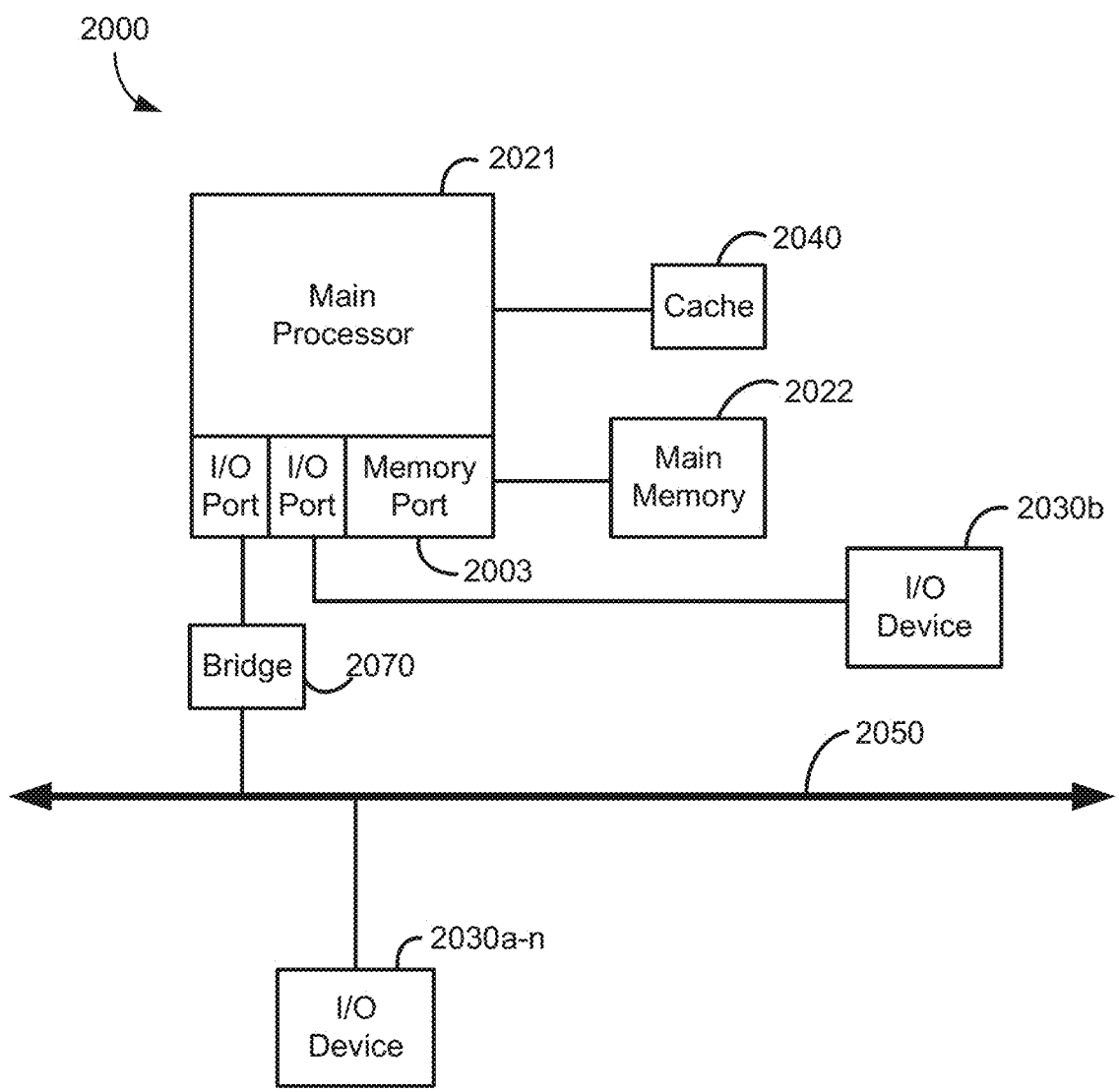

The node 2092, the communications device(s) 2002 and network device(s) 2006 may be deployed as and/or executed on any type and form of computing device, such as a computer, network device or appliance capable of communicating on any type and form of network and performing the operations described herein. FIGS. 20B and 20C depict block diagrams of a computing device 2000 useful for practicing an embodiment of the node 2092, the communication devices 2002 or the network device 2006. As shown in FIGS. 20B and 20C, each computing device 2000 includes a central processing unit 2021, and a main memory unit 2022. As shown in FIG. 20B, a computing device 2000 may include a storage device 2028, an installation device 2016, a network interface 2018, an I/O controller 2023, display devices 2024a-2024n, a keyboard 2026 and a pointing device 2027, such as a mouse. The storage device 2028 may include, without limitation, an operating system and/or software. As shown in FIG. 20C, each computing device 2000 may also include additional optional elements, such as a memory port 2003, a bridge 2070, one or more input/output devices 2030a-2030n (generally referred to using reference numeral 2030), and a cache memory 2040 in communication with the central processing unit 2021.

The central processing unit 2021 is any logic circuitry that responds to and processes instructions fetched from the main memory unit 2022. In many embodiments, the central processing unit 2021 is provided by a microprocessor unit, such as: those manufactured by Intel Corporation of Santa Clara, Calif.; those manufactured by International Business Machines of White Plains, N.Y.; or those manufactured by Advanced Micro Devices of Sunnyvale, Calif. The computing device 2000 may be based on any of these processors, or any other processor capable of operating as described herein.

Main memory unit 2022 may be one or more memory chips capable of storing data and allowing any storage location to be directly accessed by the microprocessor 2021, such as any type or variant of Static random access memory (SRAM), Dynamic random access memory (DRAM), Ferroelectric RAM (FRAM), NAND Flash, NOR Flash and Solid State Drives (SSD). The main memory 2022 may be based on any of the above described memory chips, or any other available memory chips capable of operating as described herein. In the embodiment shown in FIG. 20B, the processor 2021 communicates with main memory 2022 via a system bus 2050 (described in more detail below). FIG. 20C depicts an embodiment of a computing device 2000 in which the processor communicates directly with main memory 2022 via a memory port 2003. For example, in FIG. 20C the main memory 2022 may be DRDRAM.

FIG. 20C depicts an embodiment in which the main processor 2021 communicates directly with cache memory 2040 via a secondary bus, sometimes referred to as a backside bus. In other embodiments, the main processor 2021 communicates with cache memory 2040 using the system bus 2050. Cache memory 2040 typically has a faster response time than main memory 2022 and is provided by, for example, SRAM, BSRAM, or EDRAM. In the embodiment shown in FIG. 20C, the processor 2021 communicates with various I/O devices 2030 via a local system bus 2050. Various buses may be used to connect the central processing unit 2021 to any of the I/O devices 2030, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 2024, the processor 2021 may use an Advanced Graphics Port (AGP) to communicate with the display 2024. FIG. 20C depicts an embodiment of a computer 2000 in which the main processor 2021 may communicate directly with I/O device 2030b, for example via HYPERTRANSPORT, RAPIDIO, or INFINIBAND communications technology. FIG. 20C also depicts an embodiment in which local busses and direct communication are mixed: the processor 2021 communicates with I/O device 2030a using a local interconnect bus while communicating with I/O device 2030b directly.

A wide variety of I/O devices 2030a-2030n may be present in the computing device 2000. Input devices include keyboards, mice, trackpads, trackballs, microphones, dials, touch pads, touch screen, and drawing tablets. Output devices include video displays, speakers, inkjet printers, laser printers, projectors, and dye-sublimation printers. The I/O devices may be controlled by an I/O controller 2023 as shown in FIG. 20B. The I/O controller may control one or more I/O devices such as a keyboard 2026 and a pointing device 2027, e.g., a mouse or optical pen. Furthermore, an I/O device may also provide storage and/or an installation medium 2016 for the computing device 2000. In still other embodiments, the computing device 2000 may provide USB connections (not shown) to receive handheld USB storage devices such as the USB Flash Drive line of devices manufactured by Twintech Industry, Inc. of Los Alamitos, Calif.

Referring again to FIG. 20B, the computing device 2000 may support any suitable installation device 2016, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 2000 may further include a storage device, such as one or more hard disk drives or redundant arrays of independent disks, for storing an operating system and other related software, and for storing application software programs such as any program or software 2020 for implementing (e.g., configured and/or designed for) the systems and methods described herein. Optionally, any of the installation devices 2016 could also be used as the storage device. Additionally, the operating system and the software can be run from a bootable medium.

Furthermore, the computing device 2000 may include a network interface 2018 to interface to the network 2004 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 2000 communicates with other computing devices 2000' via any type and/or form of gateway or tunneling protocol such as Secure Socket Layer (SSL) or Transport Layer Security (TLS). The network interface 2018 may include a built-in network adapter, network interface card, PCMCIA network card, card bus network adapter, wireless network adapter, USB network adapter, modem or any other device suitable for interfacing the computing device 2000 to any type of network capable of communication and performing the operations described herein.

In some embodiments, the computing device 2000 may include or be connected to one or more display devices 2024a-2024n. As such, any of the I/O devices 2030a-2030n and/or the I/O controller 2023 may include any type and/or form of suitable hardware, software, or combination of hardware and software to support, enable or provide for the connection and use of the display device(s) 2024a-2024n by the computing device 2000. For example, the computing device 2000 may include any type and/or form of video adapter, video card, driver, and/or library to interface, communicate, connect or otherwise use the display device(s) 2024a-2024n. In one embodiment, a video adapter may include multiple connectors to interface to the display device(s) 2024a-2024n. In other embodiments, the computing device 2000 may include multiple video adapters, with each video adapter connected to the display device(s) 2024a-2024n. In some embodiments, any portion of the operating system of the computing device 2000 may be configured for using multiple displays 2024a-2024n. One ordinarily skilled in the art will recognize and appreciate the various ways and embodiments that a computing device 2000 may be configured to have one or more display devices 2024a-2024n.

In further embodiments, an I/O device 2030 may be a bridge between the system bus 2050 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 2000 of the sort depicted in FIGS. 20B and 20C may operate under the control of an operating system, which control scheduling of tasks and access to system resources. The computing device 2000 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 2000 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 2000 has sufficient processor power and memory capacity to perform the operations described herein.

In some embodiments, the computing device 2000 may have different processors, operating systems, and input devices consistent with the device. For example, in one embodiment, the computing device 2000 is a smart phone, mobile device, tablet or personal digital assistant. In still other embodiments, the computing device 2000 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the computing device 2000 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" may refer to user-associated devices, for example, consistent with the terms "user" and "multi-user" typically used in the context of a multi-user multiple-input and multiple-output (MU-MIMO) environment.

Although examples of communications systems described above may include devices and network devices operating according to PAM4 DFE protocol, it should be understood that embodiments of the systems and methods described can operate according to other standards.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. An apparatus comprising:
   a first set of slicers comprising input ports to receive a first input signal, the first set of slicers configured to generate a first slicer output signal comprising outputs of the first set of slicers, the first slicer output signal digitally indicating a level of the first input signal;
   a first speculative tap comprising input ports coupled to output ports of the first set of slicers, the first speculative tap configured to select outputs of a subset of the first set of slicers based on a second slicer output signal, wherein the first speculative tap comprises:
      a first set of multiplexers comprising input ports coupled to output ports of the first set of slicers, and
      a first set of latches comprising input ports coupled to output ports of the first set of multiplexers;
   a first decoder comprising input ports coupled to output ports of the first speculative tap, the first decoder configured to decode the selected outputs of the subset of the first set of slicers in a first digital representation into a second digital representation;
   a first feedback generator comprising:
      input ports coupled to output ports of the first decoder, and
      output ports coupled to the input ports of the first set of slicers, the first feedback generator configured to generate a first feedback signal according to the decoded outputs of the subset of the first set of slicers and to output the first feedback signal at its output ports;
   a second set of slicers comprising input ports to receive a second input signal, the second set of slicers configured to generate the second slicer output signal comprising outputs of the second set of slicers, the second slicer output signal digitally indicating a level of the second input signal;
   a second speculative tap comprising input ports coupled to output ports of the second set of slicers, the second speculative tap configured to select outputs of a subset of the second set of slicers based on the first slicer output signal;
   a second decoder comprising input ports coupled to output ports of the second speculative tap, the second decoder configured to decode the selected outputs of the subset of the second set of slicers in the first digital representation into the second digital representation; and a second feedback generator comprising:
input ports coupled to output ports of the second decoder, and
output ports coupled to the input ports of the second set of slicers, the second feedback generator configured to generate a second feedback signal according to the decoded outputs of the subset of the second set of slicers, and output the second feedback signal at its output ports.

2. The apparatus of claim 1,
wherein the first speculative tap is configured to select the outputs of the subset of the first set of slicers according to the selected outputs of the subset of the second set of slicers, and
wherein the second speculative tap is configured to select the outputs of the subset of the second set of slicers according to the selected outputs of the subset of the first set of slicers.

3. The apparatus of claim 1, wherein the second speculative tap comprises:
a second set of multiplexers comprising input ports coupled to output ports of the second set of slicers, and
a second set of latches comprising input ports coupled to output ports of the second set of multiplexers.

4. The apparatus of claim 3,
wherein the output ports of the first set of multiplexers are directly coupled to the input ports of the first set of latches, and
wherein the output ports of the second set of multiplexers are directly coupled to the input ports of the second set of latches.

5. The apparatus of claim 4,
wherein output ports of the first set of latches are directly coupled to control ports of the second set of multiplexers, and
wherein output ports of the second set of latches are directly coupled to control ports of the first set of multiplexers.

6. The apparatus of claim 3,
wherein each multiplexer of the first set of multiplexers is controlled according to outputs of the second set of latches, and
wherein each multiplexer of the second set of multiplexers is controlled according to outputs of the first set of latches.

7. The apparatus of claim 3,
wherein the first set of latches is clocked according to a clock signal, and
wherein the second set of latches is clocked according to an inverse of the clock signal.

8. The apparatus of claim 1, further comprising
a first feedback tap comprising:
input ports coupled to the output ports of the first decoder, and
output ports coupled to the input ports of the second set of slicers, the first feedback tap configured to generate a third feedback signal according to the decoded outputs of the subset of the first set of slicers and to output the third feedback signal at its output ports, the third feedback signal to modify the second input signal; and
a second feedback tap comprising:
input ports coupled to the output ports of the second decoder, and
output ports coupled to the input ports of the first set of slicers, the second feedback tap configured to generate a fourth feedback signal according to the decoded outputs of the subset of the second set of slicers and to output the fourth feedback signal at its output ports, the fourth feedback signal to modify the first input signal.

9. An apparatus comprising:
a first set of slicers comprising input ports to receive a first input signal, the first set of slicers configured to generate a first slicer output signal comprising outputs of the first set of slicers, the first slicer output signal digitally indicating a level of the first input signal;
a first speculative tap comprising input ports coupled to output ports of the first set of slicers, the first speculative tap configured to select outputs of a subset of the first set of slicers based on a second slicer output signal;
a first decoder comprising input ports coupled to output ports of the first speculative tap, the first decoder configured to decode the selected outputs of the subset of the first set of slicers in a first digital representation into a second digital representation; and
a first feedback generator comprising:
input ports coupled to output ports of the first decoder, and
output ports coupled to the input ports of the first set of slicers, the first feedback generator configured to generate a first feedback signal according to the decoded outputs of the subset of the first set of slicers and to output the first feedback signal at its output ports, wherein the first feedback generator comprises:
a single-ended to differential converter comprising:
an input port coupled to a corresponding output port from the output ports of the first decoder, and
differential output ports, the single-ended to differential converter configured to convert a single ended signal at the input port of the single-ended to differential converter into differential signals and output the differential signals through the differential output ports, the differential signals to modify the first input signal.

10. The apparatus of claim 9, wherein the first feedback generator further comprises:
a crossing point controller coupled to the input port of the single-ended to differential converter and a control port of the single-ended to differential converter, the crossing point controller configured to delay one of a pull up or a pull down of a first signal of the differential signals without delaying the other one of the pull up or the pull down of the first signal.

11. The apparatus of claim 10, further comprising:
a pull up transistor coupled between one of the differential output ports and the other of the differential output ports.

12. The apparatus of claim 10, wherein the single-ended to differential converter comprises:
a P-type transistor and an N-type transistor coupled in parallel with each other between the input port of the single-ended to differential converter and one of the differential output ports, a gate electrode of the P-type transistor coupled to an output port of the crossing point controller, a gate electrode of the N-type transistor coupled to a supply port, at which a supply voltage is supplied.

13. An apparatus comprising:
a latch;
a single-ended to differential converter coupled to the latch, the single-ended to differential converter configured to convert a single ended signal from the latch into differential signals; and
a crossing point controller coupled between the latch and the single-ended to differential converter, the crossing point controller configured to delay one of a pull up or a pull down of a first signal of the differential signals without delaying the other one of the pull up or the pull down of the first signal.

14. The apparatus of claim 13, wherein the single-ended to differential converter comprises:
a first transistor having a gate electrode controlled by the crossing point controller, and
a second transistor having a gate electrode coupled to a supply port, at which a supply voltage is supplied, the first transistor and the second transistor coupled to each other in parallel.

15. The apparatus of claim 13, wherein the apparatus is a feedback tap.

16. The apparatus of claim 14, further comprising an inverter coupled to the first transistor and the second transistor, the inverter to output a second signal of the differential signals according to the single ended signal from the latch.

17. The apparatus of claim 14, wherein the first transistor is a P-type transistor and the second transistor is an N-type transistor.

18. The apparatus of claim 13, further comprising:
a pull up transistor coupled between a first output of the single-ended to differential converter and a second output of the single-ended to differential converter.

19. The apparatus of claim 13, further comprising an amplifier coupled to the single-ended to differential converter, the amplifier to amplify the differential signals.

20. The apparatus of claim 9, further comprising an amplifier coupled to the differential output ports of the single-ended to differential converter, the amplifier to amplify the differential signals.

* * * * *